US011107657B2

(12) United States Patent
Ren et al.

(10) Patent No.: US 11,107,657 B2
(45) Date of Patent: Aug. 31, 2021

(54) APPARATUS OF PLURAL CHARGED-PARTICLE BEAMS

(71) Applicant: ASML Netherlands B.V., AH Veldhoven (NL)

(72) Inventors: Weiming Ren, San Jose, CA (US); Shuai Li, Beijing (CN); Xuedong Liu, San Jose, CA (US); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/866,482

(22) Filed: May 4, 2020

(65) Prior Publication Data

US 2020/0388464 A1    Dec. 10, 2020

Related U.S. Application Data

(60) Continuation of application No. 16/398,178, filed on Apr. 29, 2019, now Pat. No. 10,643,820, which is a
(Continued)

(51) Int. Cl.
*H01J 37/28* (2006.01)
*H01J 37/147* (2006.01)
(Continued)

(52) U.S. Cl.
CPC .............. *H01J 37/28* (2013.01); *H01J 29/51* (2013.01); *H01J 37/05* (2013.01); *H01J 37/063* (2013.01);
(Continued)

(58) Field of Classification Search
CPC ........ H01J 37/28; H01J 37/12; H01J 37/1472; H01J 37/05; H01J 37/063; H01J 37/1477;
(Continued)

(56) References Cited

U.S. PATENT DOCUMENTS 6,175,122 B1    1/2001  Groves et al.
6,630,681 B1   10/2003  Kojima
(Continued)

FOREIGN PATENT DOCUMENTS

EP   2 879 155 A1    6/2015
JP   10-339711      12/1998
(Continued)

OTHER PUBLICATIONS

Search Report issued by the Singapore Patent Office in related Application No. 10201901384P, dated Aug. 3, 2020 (2 pgs.).
(Continued)

*Primary Examiner* — Kiet T Nguyen
(74) *Attorney, Agent, or Firm* — Finnegan, Henderson, Farabow, Garrett & Dunner, LLP

(57) ABSTRACT

A multi-beam apparatus for observing a sample with high resolution and high throughput is proposed. In the apparatus, a source-conversion unit changes a single electron source into a virtual multi-source array, a primary projection imaging system projects the array to form plural probe spots on the sample, and a condenser lens adjusts the currents of the plural probe spots. In the source-conversion unit, the image-forming means is on the upstream of the beamlet-limit means, and thereby generating less scattered electrons. The image-forming means not only forms the virtual multi-source array, but also compensates the off-axis aberrations of the plurality of probe spots.

19 Claims, 19 Drawing Sheets

Related U.S. Application Data continuation of application No. 16/167,429, filed on Oct. 22, 2018, now Pat. No. 10,276,347, which is a division of application No. 15/633,639, filed on Jun. 26, 2017, now Pat. No. 10,109,456, which is a continuation of application No. 15/403,749, filed on Jan. 11, 2017, now Pat. No. 9,691,586, which is a division of application No. 15/065,342, filed on Mar. 9, 2016, now Pat. No. 9,691,588.

(60) Provisional application No. 62/130,819, filed on Mar. 10, 2015.

(51) Int. Cl.

| | | |
|---|---|---|
| *H01J 37/05* | (2006.01) | |
| *H01J 37/063* | (2006.01) | |
| *H01J 37/304* | (2006.01) | |
| *H01J 29/51* | (2006.01) | |
| *H01J 37/12* | (2006.01) | |

(52) U.S. Cl.
CPC .......... *H01J 37/12* (2013.01); *H01J 37/1472* (2013.01); *H01J 37/1477* (2013.01); *H01J 37/304* (2013.01); *H01J 2237/04924* (2013.01); *H01J 2237/083* (2013.01); *H01J 2237/1205* (2013.01); *H01J 2237/1516* (2013.01); *H01J 2237/2817* (2013.01)

(58) Field of Classification Search
CPC ............ H01J 37/304; H01J 2237/2817; H01J 2237/04924; H01J 2237/1205; H01J 2237/1516; H01J 2237/083; H01J 29/51
USPC .............. 250/310, 396 ML, 397, 398, 396 R
See application file for complete search history.

(56) References Cited

U.S. PATENT DOCUMENTS

| | | |
|---|---|---|
| 6,943,349 B2 | 9/2005 | Adamec et al. |
| 7,244,949 B2 | 7/2007 | Knippelmeyer et al. |
| 7,554,094 B2 | 6/2009 | Knippelmeyer et al. |
| 7,880,143 B2 | 2/2011 | Tanimoto et al. |
| 8,294,095 B2 | 10/2012 | Chen et al. |
| 8,378,299 B2 | 2/2013 | Frosien |
| 9,035,249 B1 | 5/2015 | Frosien et al. |
| 2003/0030007 A1 | 2/2003 | Karimata et al. |
| 2003/0085360 A1 | 5/2003 | Parker et al. |
| 2004/0135515 A1 | 7/2004 | Hamashima et al. |
| 2004/0188630 A1 | 9/2004 | Brunner et al. |
| 2005/0045821 A1 | 3/2005 | Noji et al. |
| 2005/0211921 A1 | 9/2005 | Wieland et al. |
| 2006/0134810 A1 | 6/2006 | Bullock |
| 2006/0289804 A1 | 12/2006 | Knippelmeyer et al. |
| 2008/0054184 A1 | 3/2008 | Knippelmeyer et al. |
| 2009/0014649 A1 | 1/2009 | Nakasuji et al. |
| 2009/0026389 A1 | 1/2009 | Platzgummer |
| 2009/0159810 A1 | 5/2009 | Knippelmeyer et al. |
| 2011/0216299 A1 | 9/2011 | Steenbrink et al. |
| 2012/0061565 A1 | 3/2012 | Enyama et al. |
| 2014/0103201 A1 | 4/2014 | Kramer et al. |
| 2016/0284505 A1 | 9/2016 | Ren et al. |
| 2016/0336142 A1 | 11/2016 | Liu et al. |
| 2017/0154756 A1* | 6/2017 | Ren ...................... H01J 37/292 |

FOREIGN PATENT DOCUMENTS

| | | |
|---|---|---|
| JP | 2003-331772 | 11/2003 |
| JP | 2014-082171 | 5/2014 |
| JP | 2014-229481 | 12/2014 |
| WO | WO 2002/056332 | 7/2021 |

OTHER PUBLICATIONS

Rodolfo Rose, "The Merli-Missiroli-Pozzi Two-Slit Electron-Interference Experiment", Physics in Perspective, 14 2012) 178-195, 2011 The Author(s).

Written Opinion issued by the Intellectual Property Office of Singapore (IPOS) dated May 4, 2018, for application No. 11201707178R, (4pages).

An English-language machine translation only, of a Notification of Reasons for Refusal (Japanese Office Action) dated Jul. 31, 2018, issued by the Japanese Patent Office in counterpart Japanese Patent Application No. 2017-567053.

European Search Report dated Dec. 18, 2018, European Patent Application No. 16762718.1.

Notification of Reason(s) for Refusal issued in related Japanese Patent Application No. 2020-104625; dated May 11, 2021 (10 pgs).

\* cited by examiner

Paper: Physics in Perspective, 14 (2012) 178-195 "The Merli-Missiroli-Pozzi Two-Slit Electron-Interference Experiment" Rodolfo Rosa

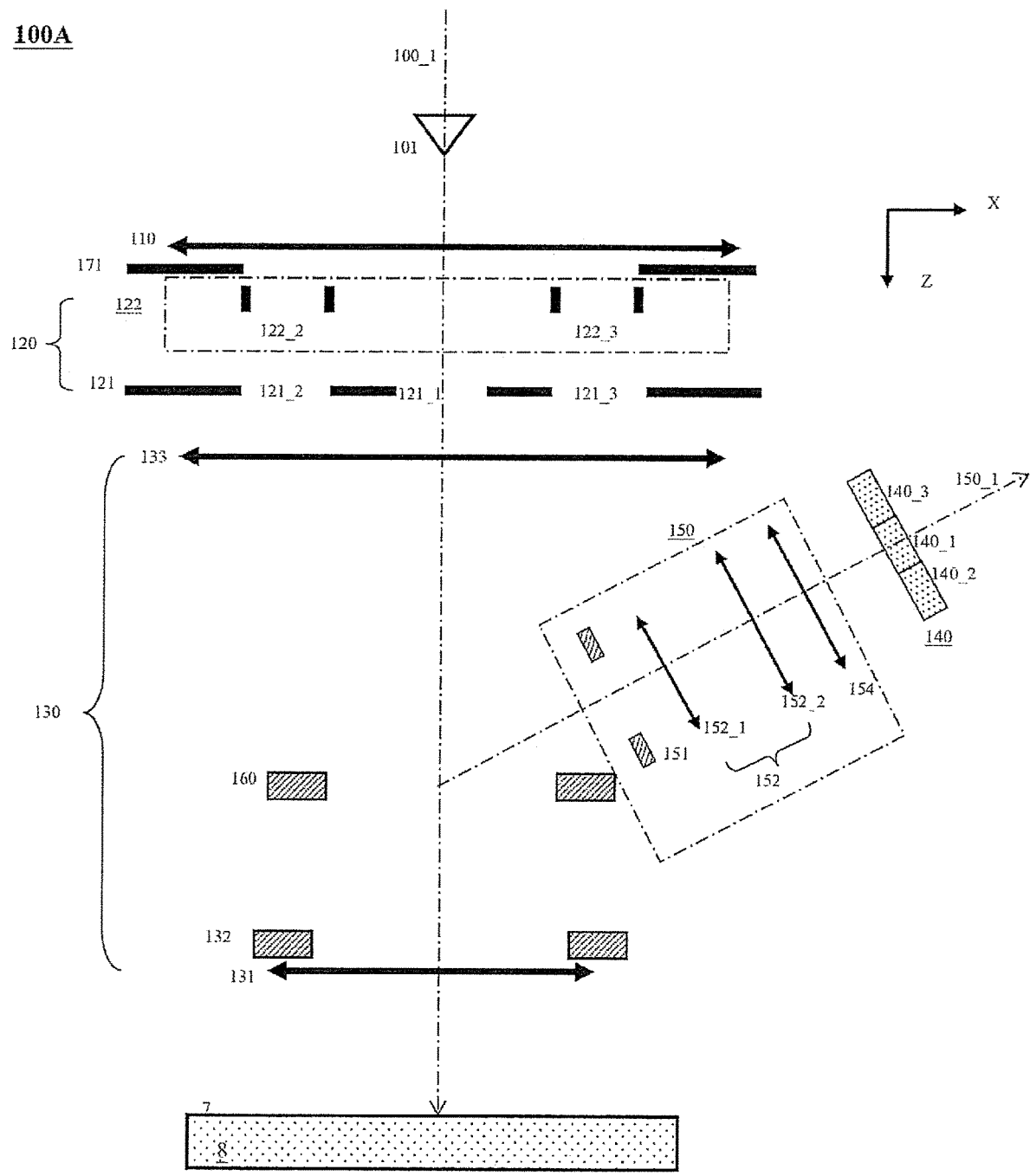
Figure 3A (Invention)

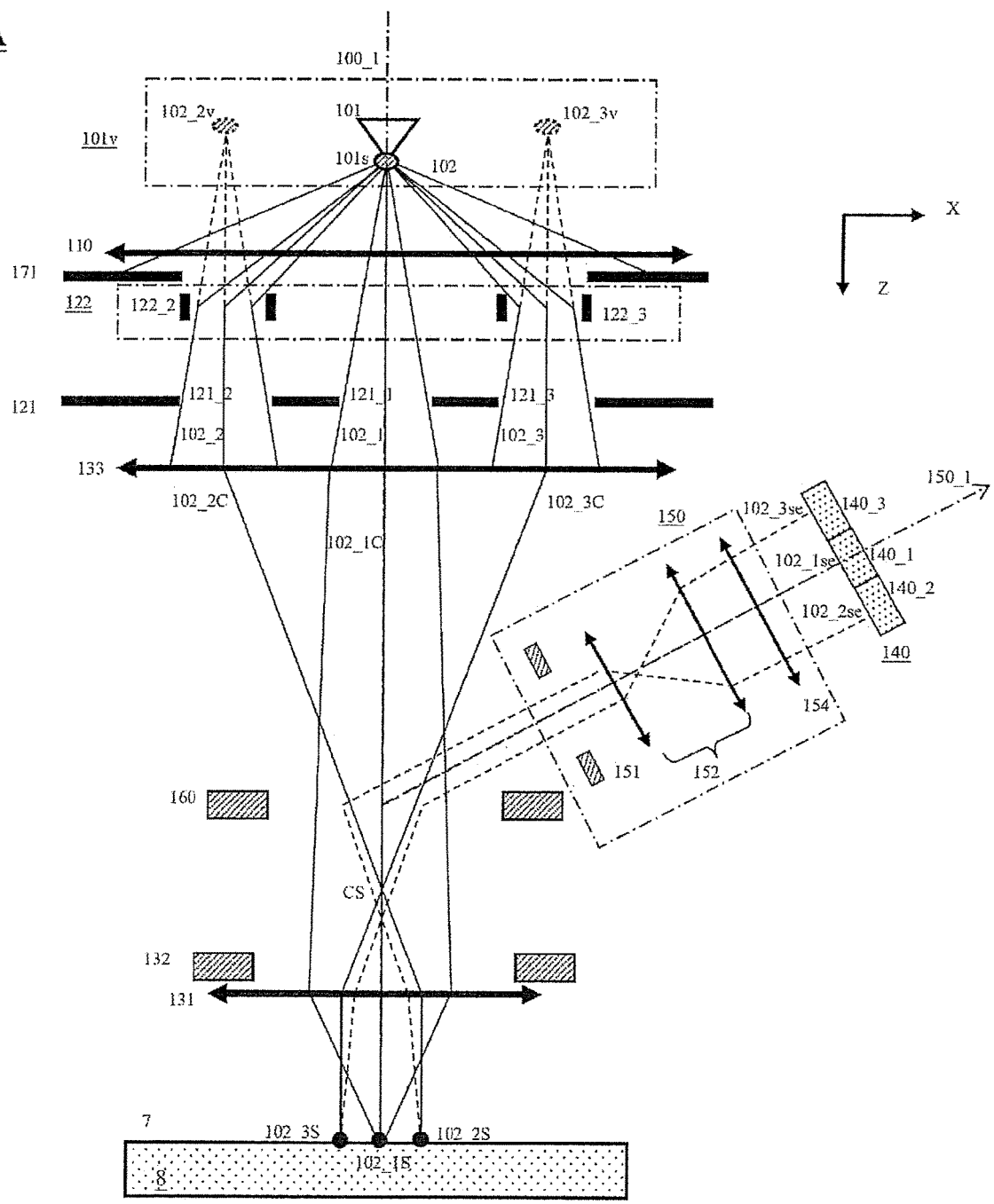
Figure 3B(Invention)

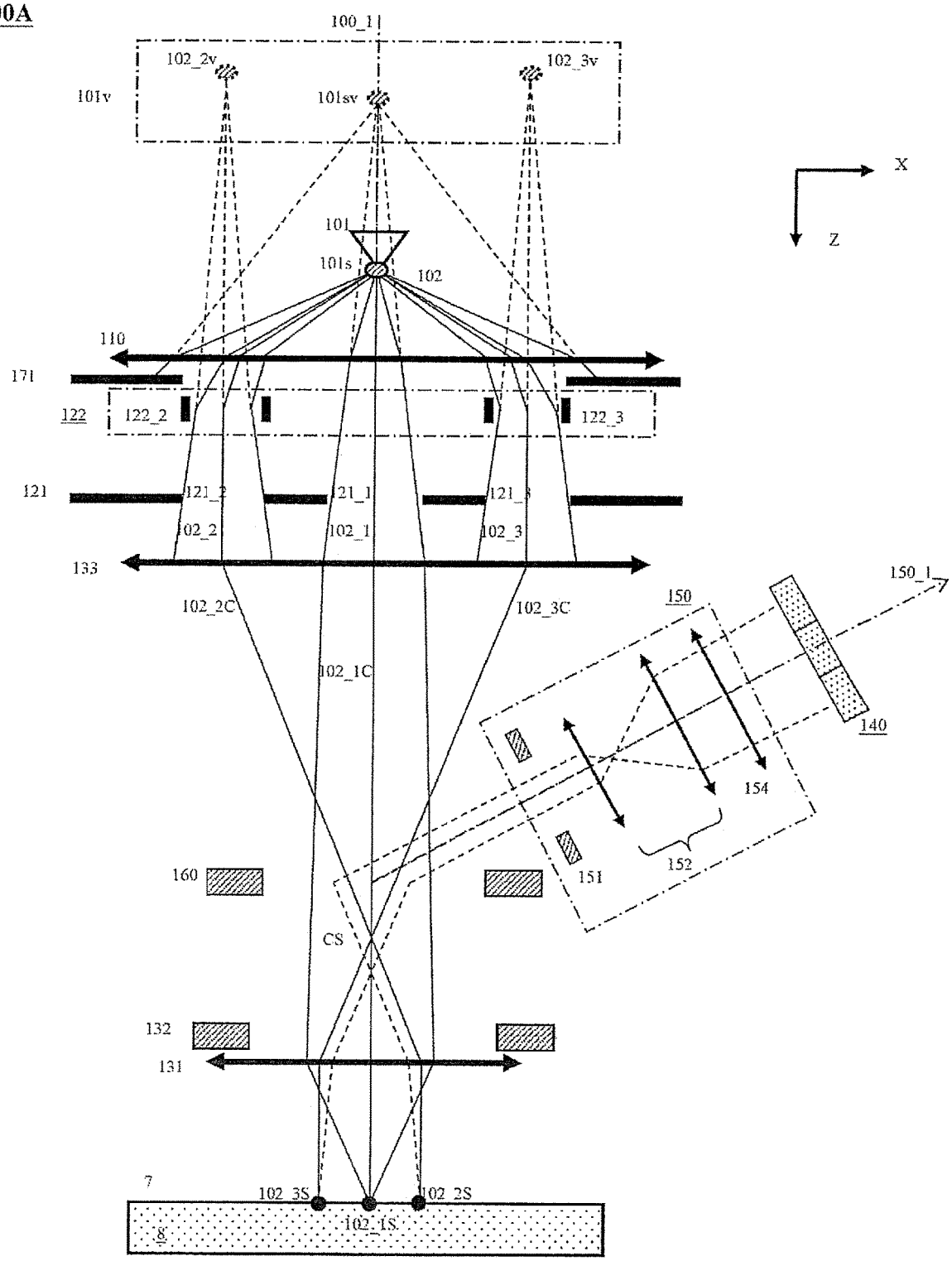
Figure 3C (Invention)

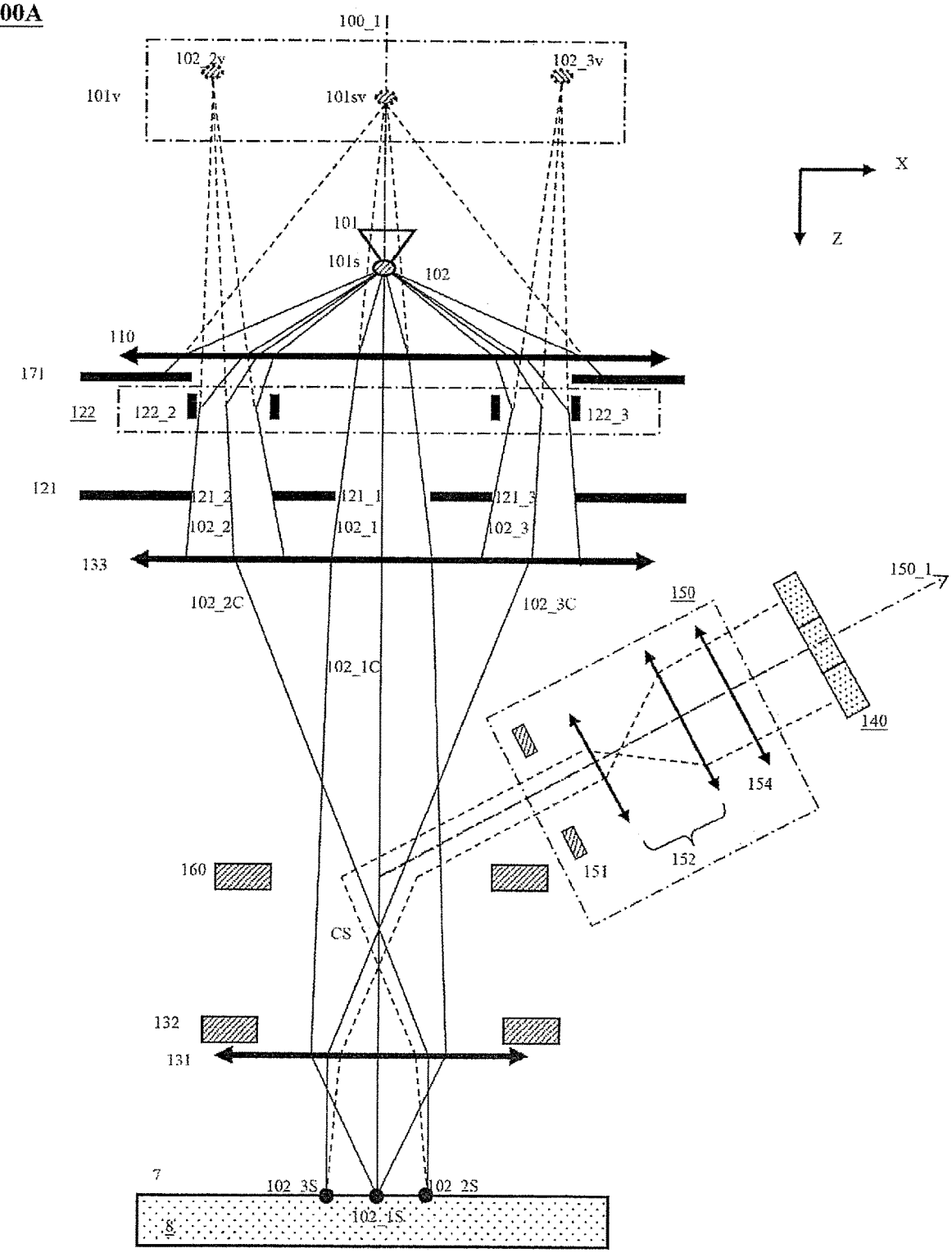
Figure 3D (Invention)

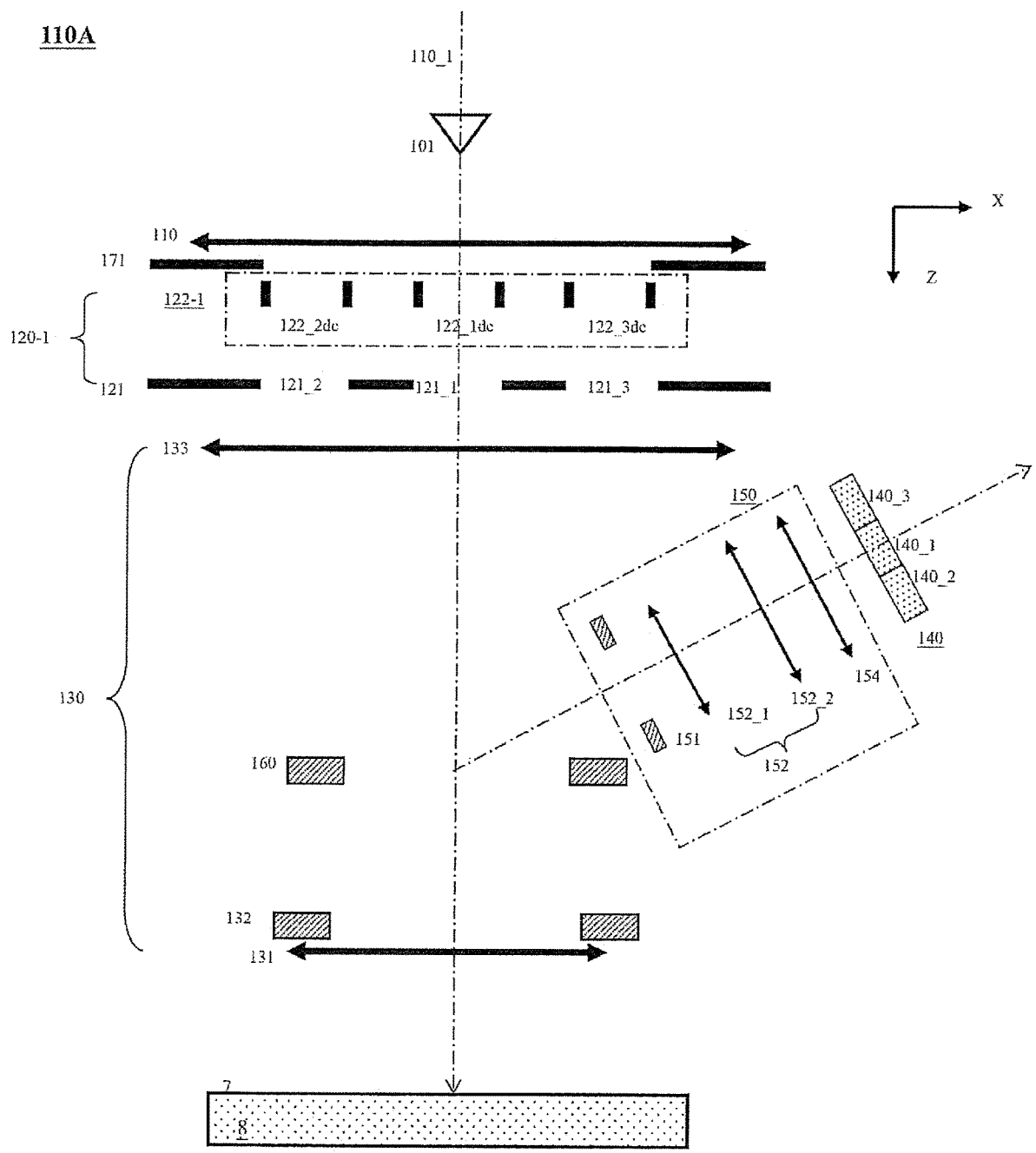
Figure 4 (Invention)

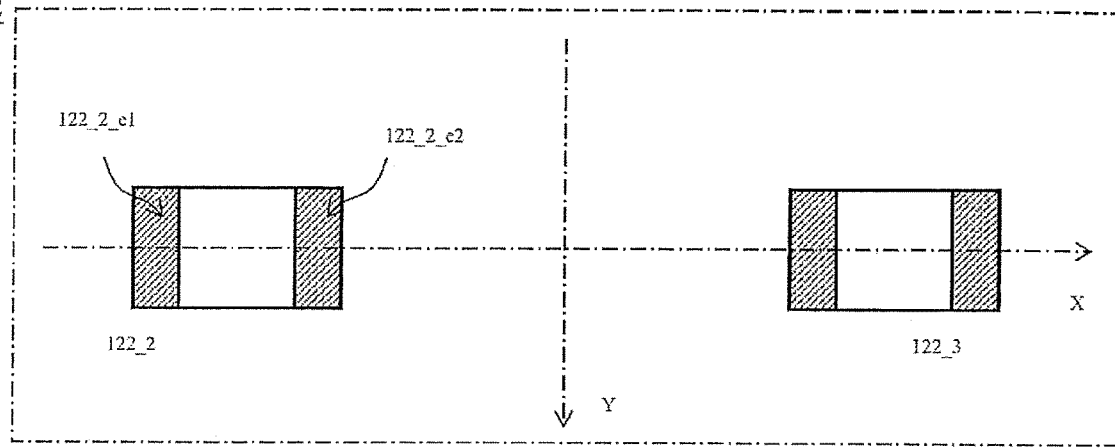
Figure 5A (Invention)
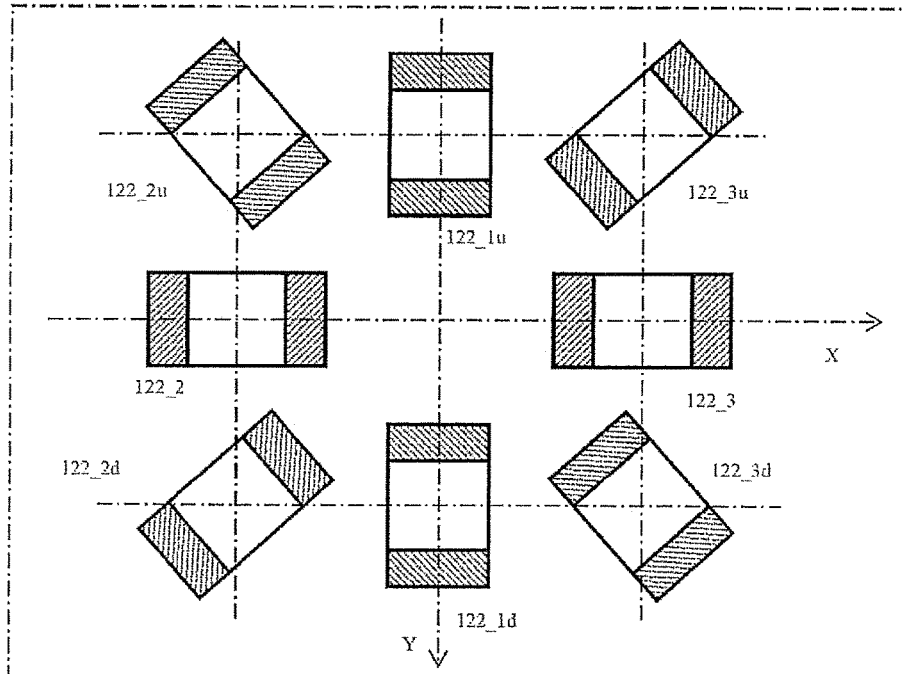
Figure 5B (Invention)

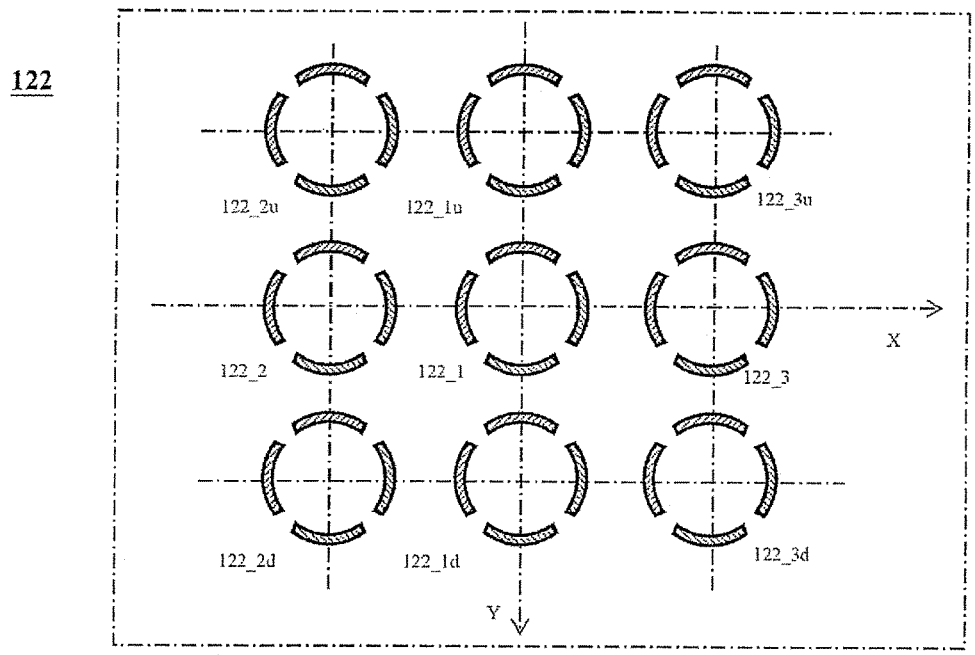
Figure 5C (Invention)
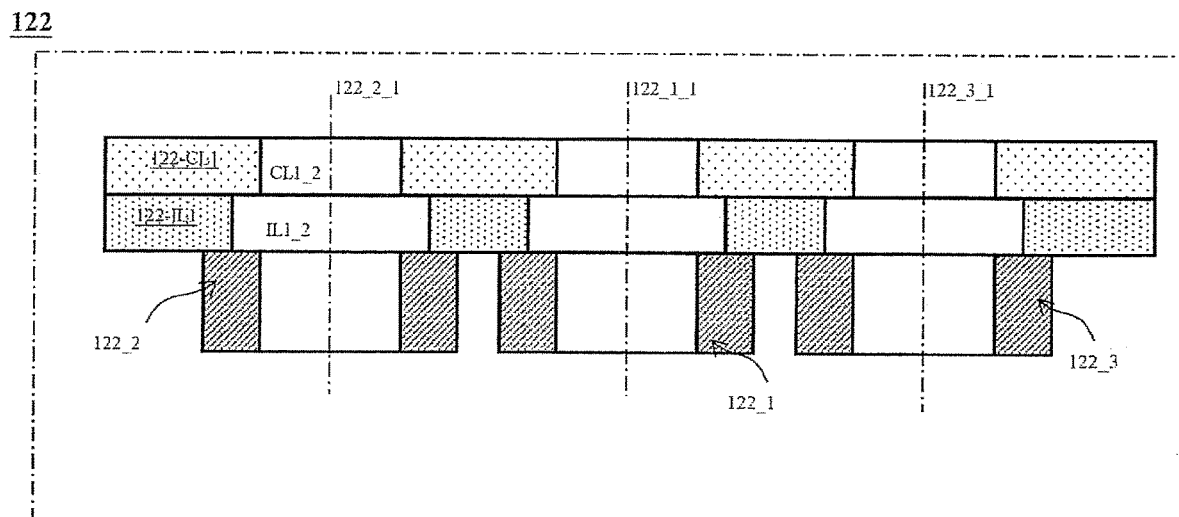
Figure 6A (Invention)

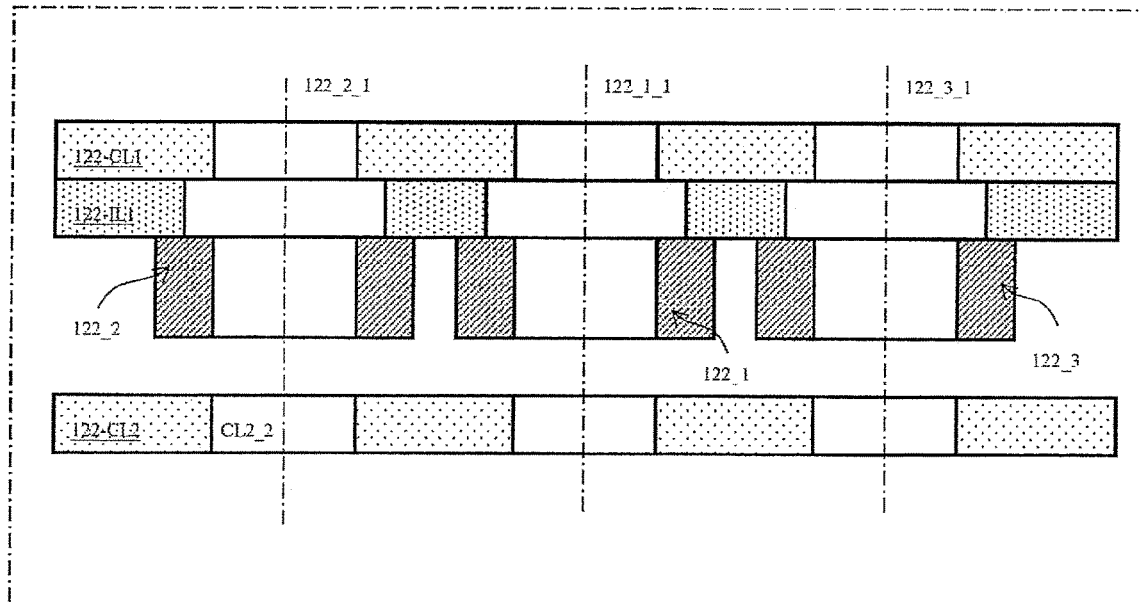
Figure 6B (Invention)
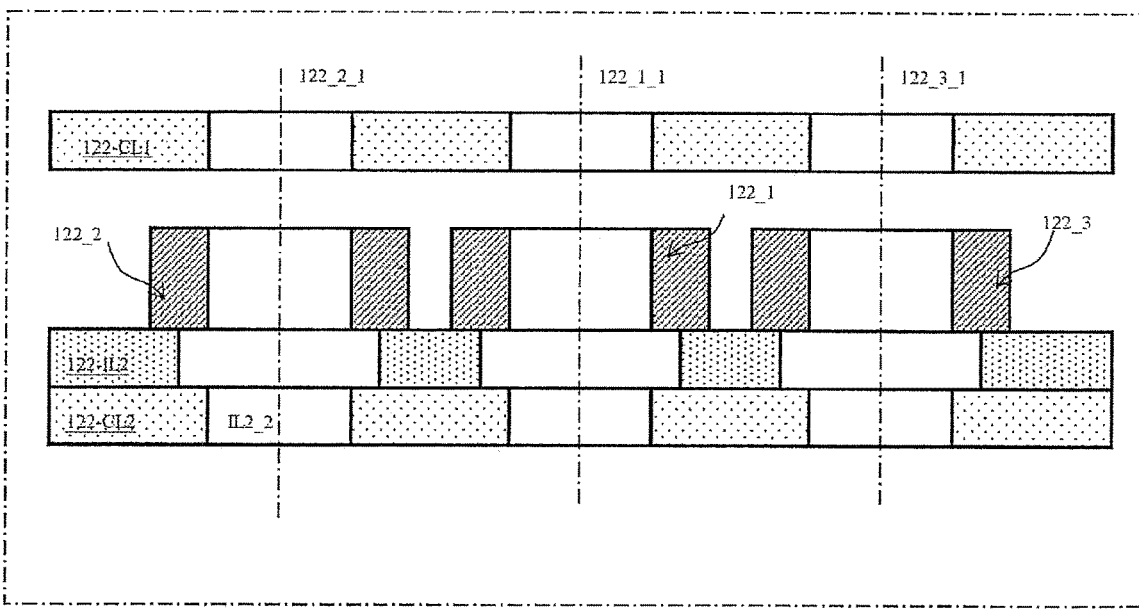
Figure 6C (Invention)

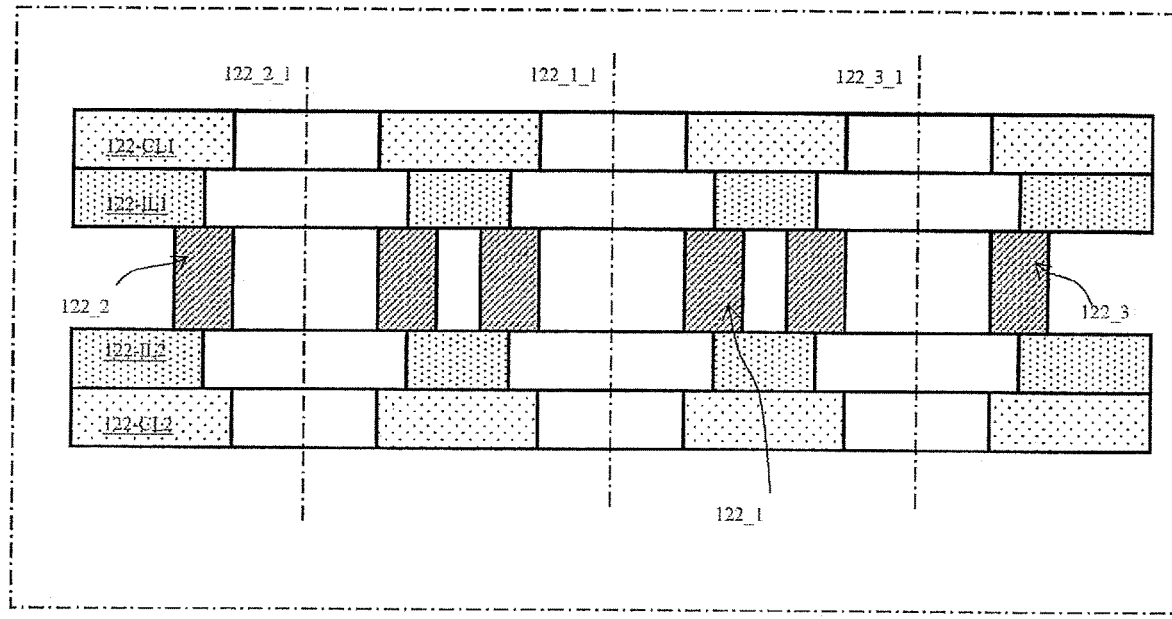
Figure 6D (Invention)
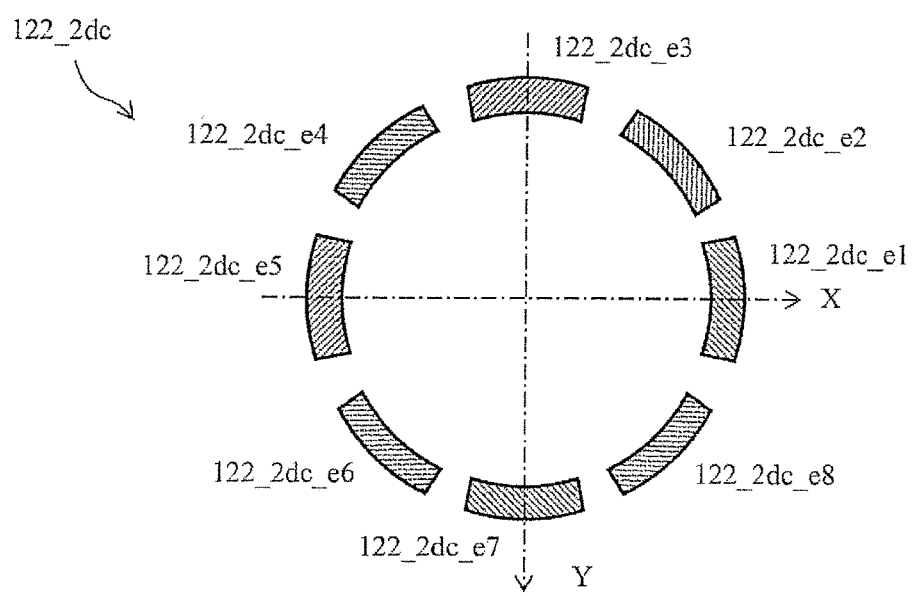
Figure 7 (Invention)

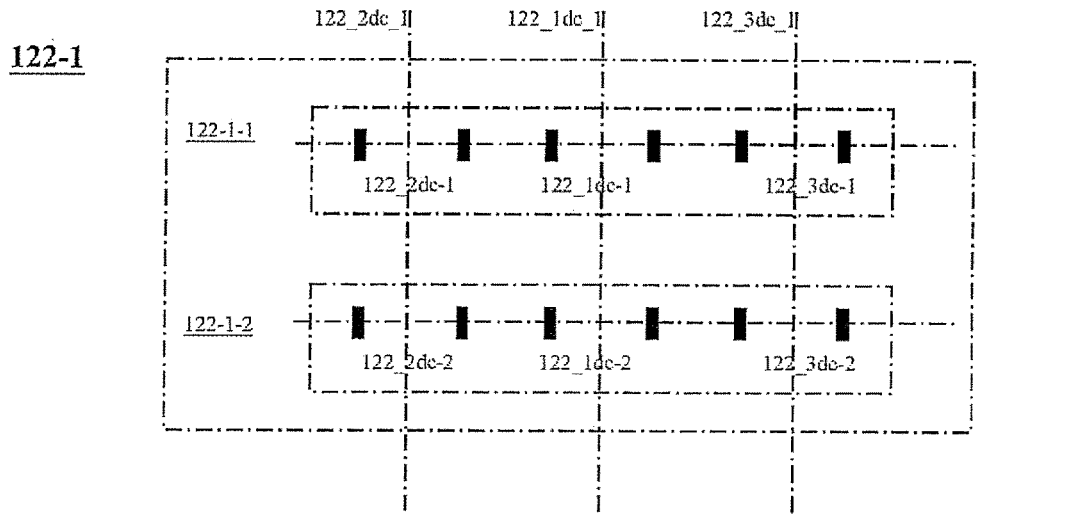
Figure 8A (Invention)
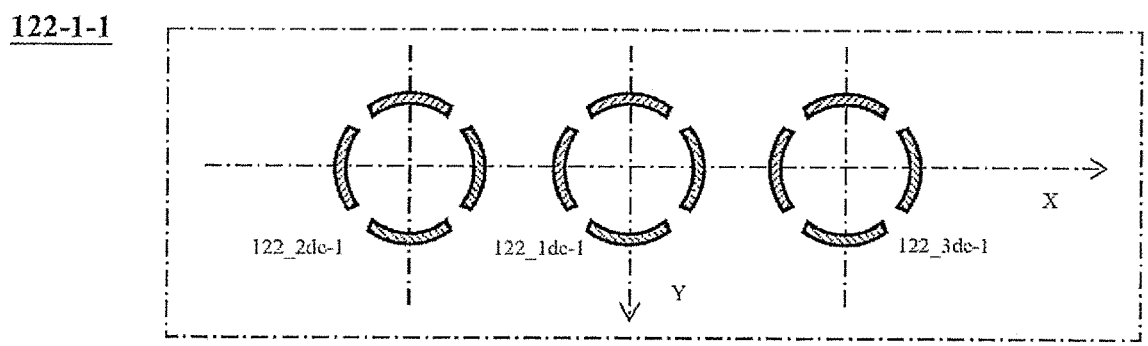
Figure 8B (Invention)
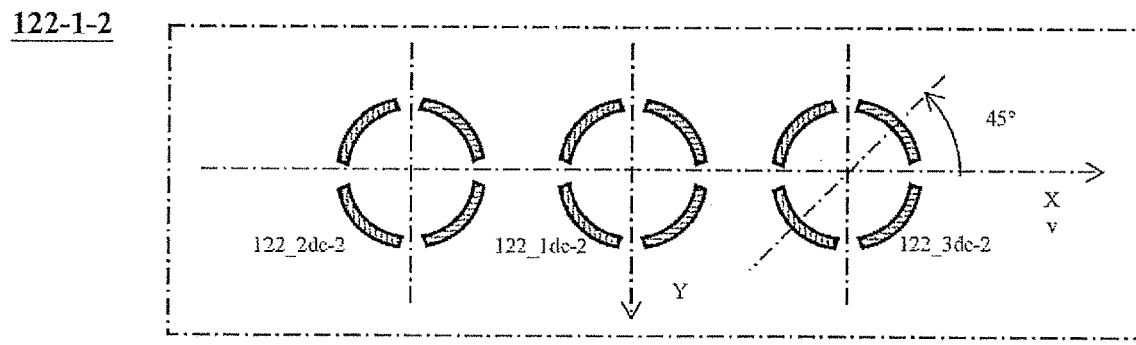
Figure 8C (Invention)

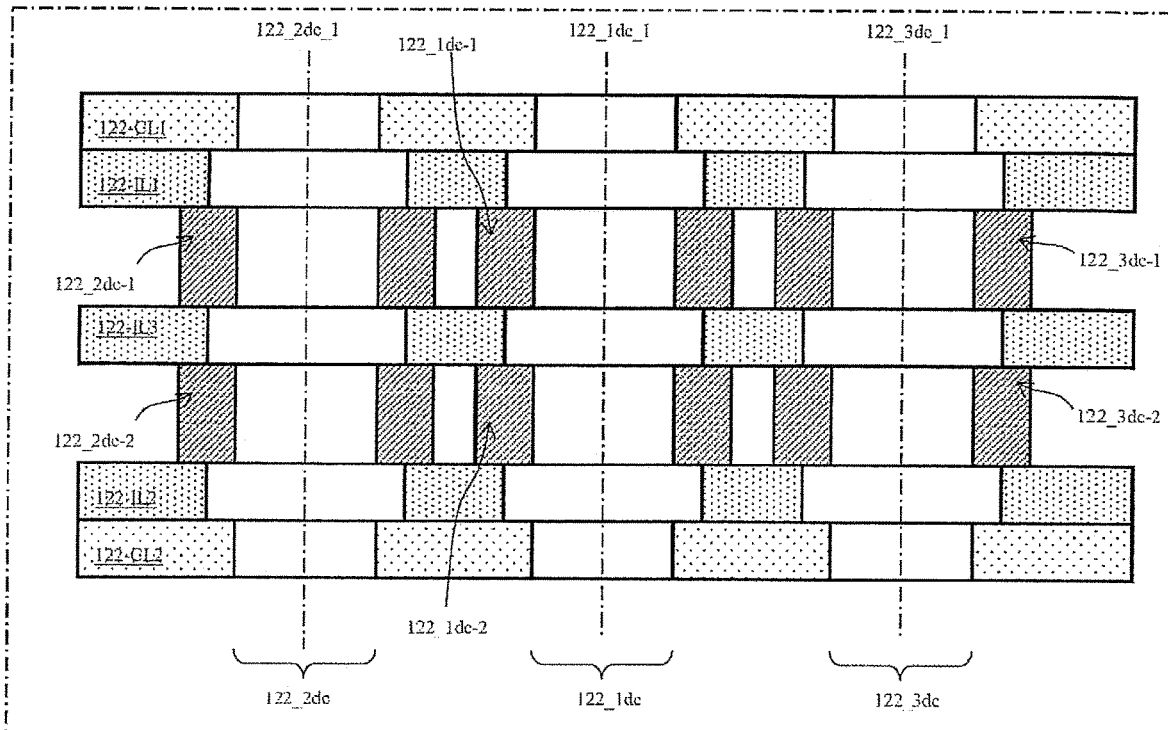
Figure 8D (Invention)

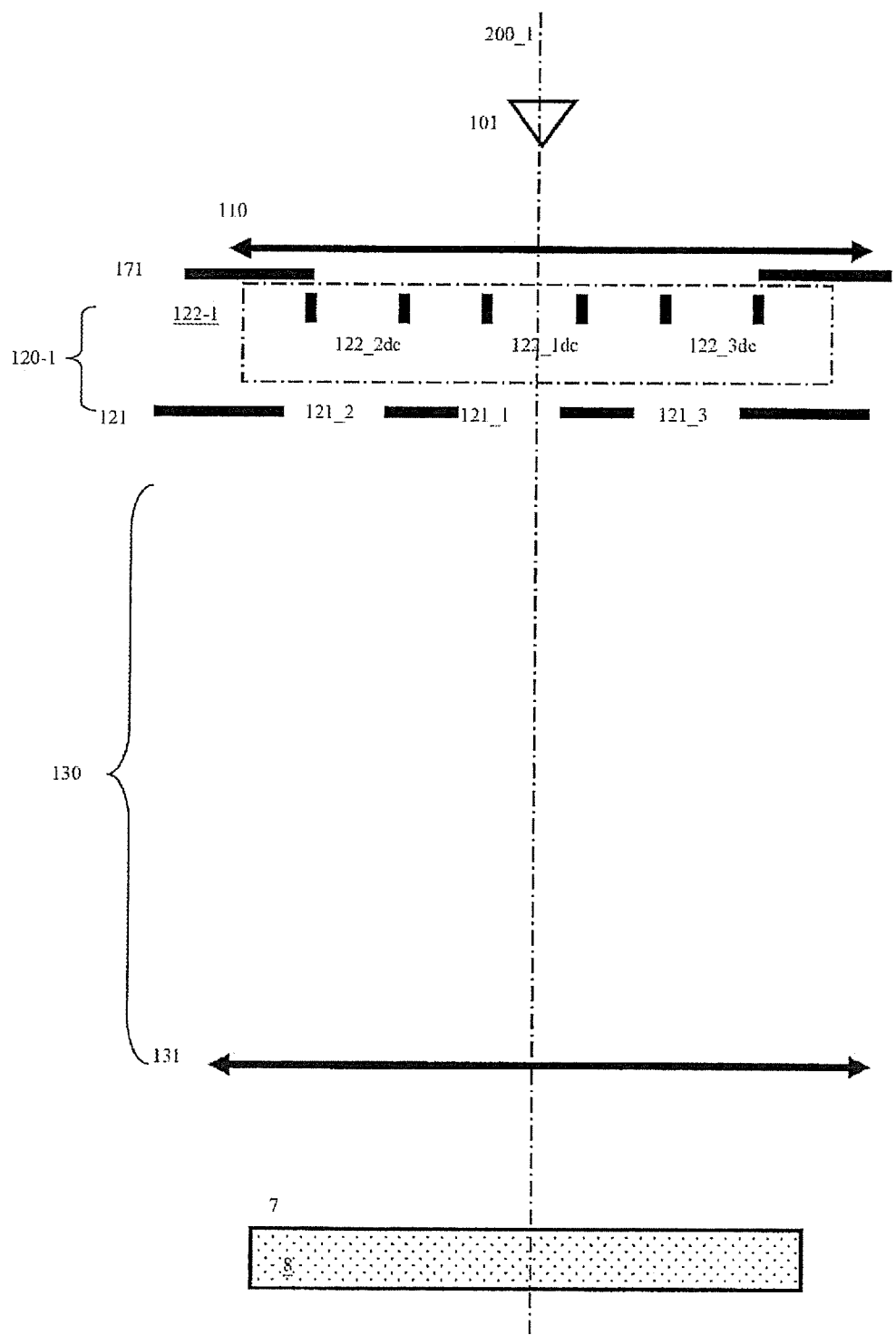
Figure 9A (Invention)

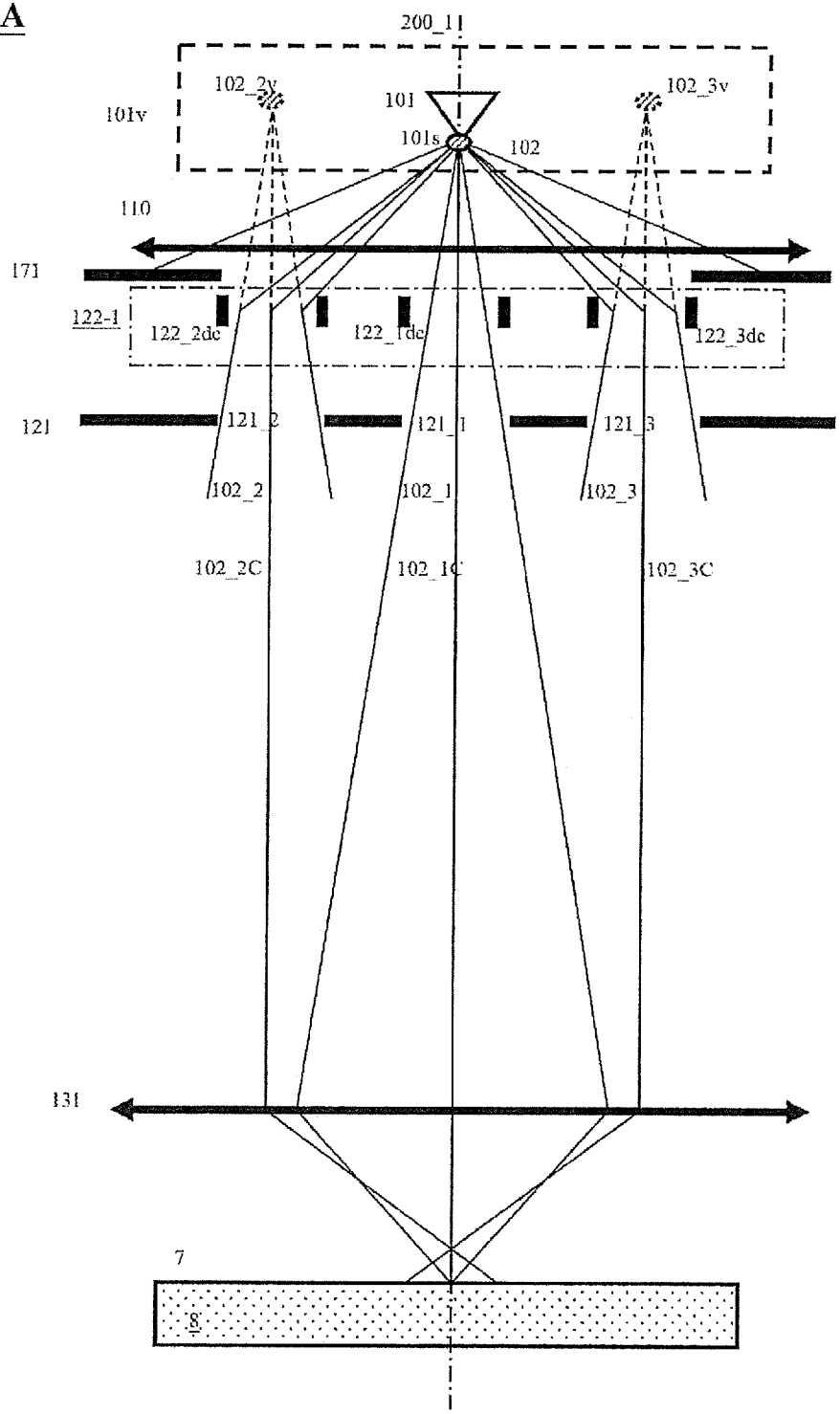
Figure 9B (Invention)

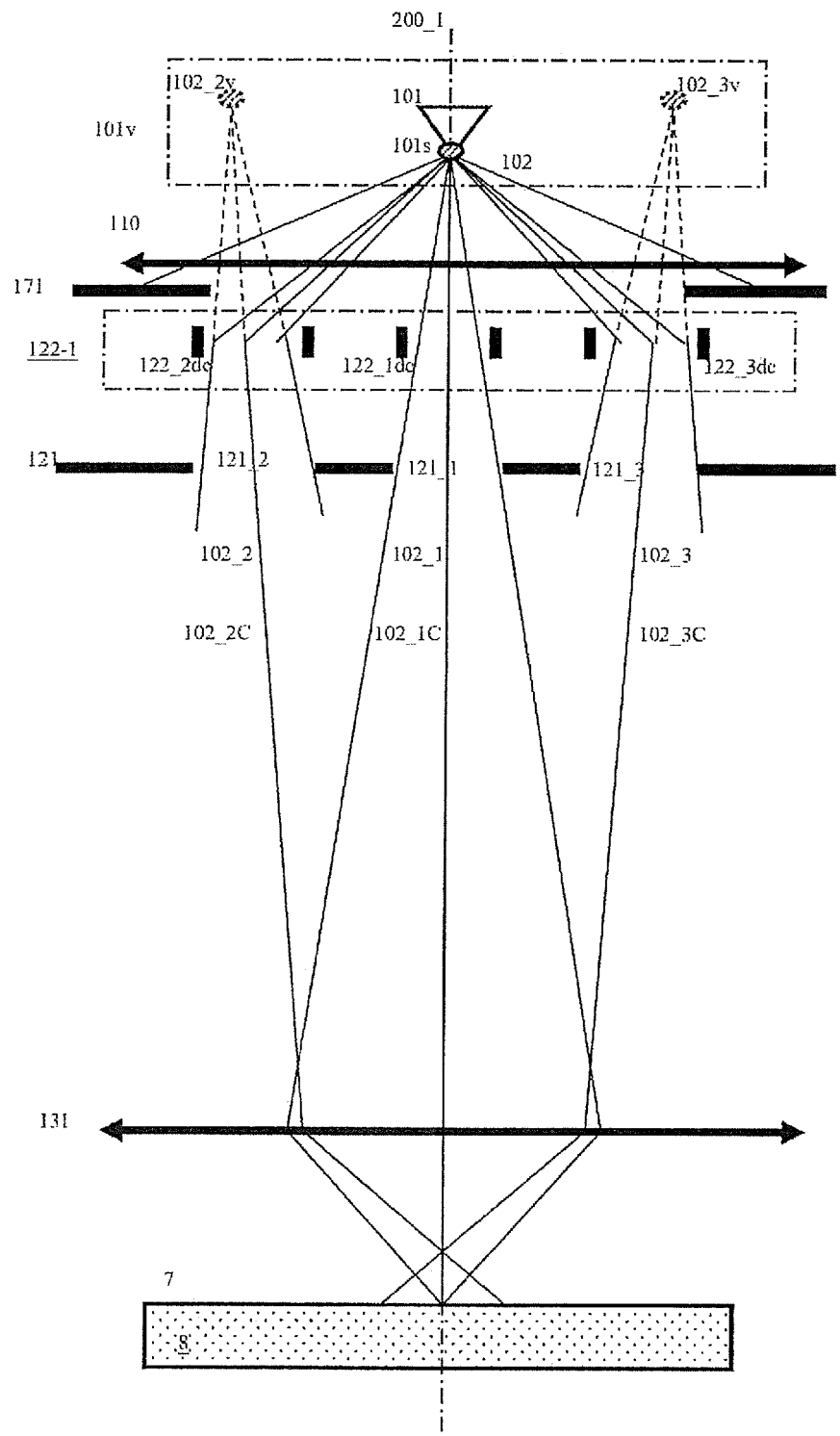
Figure 9C (Invention)

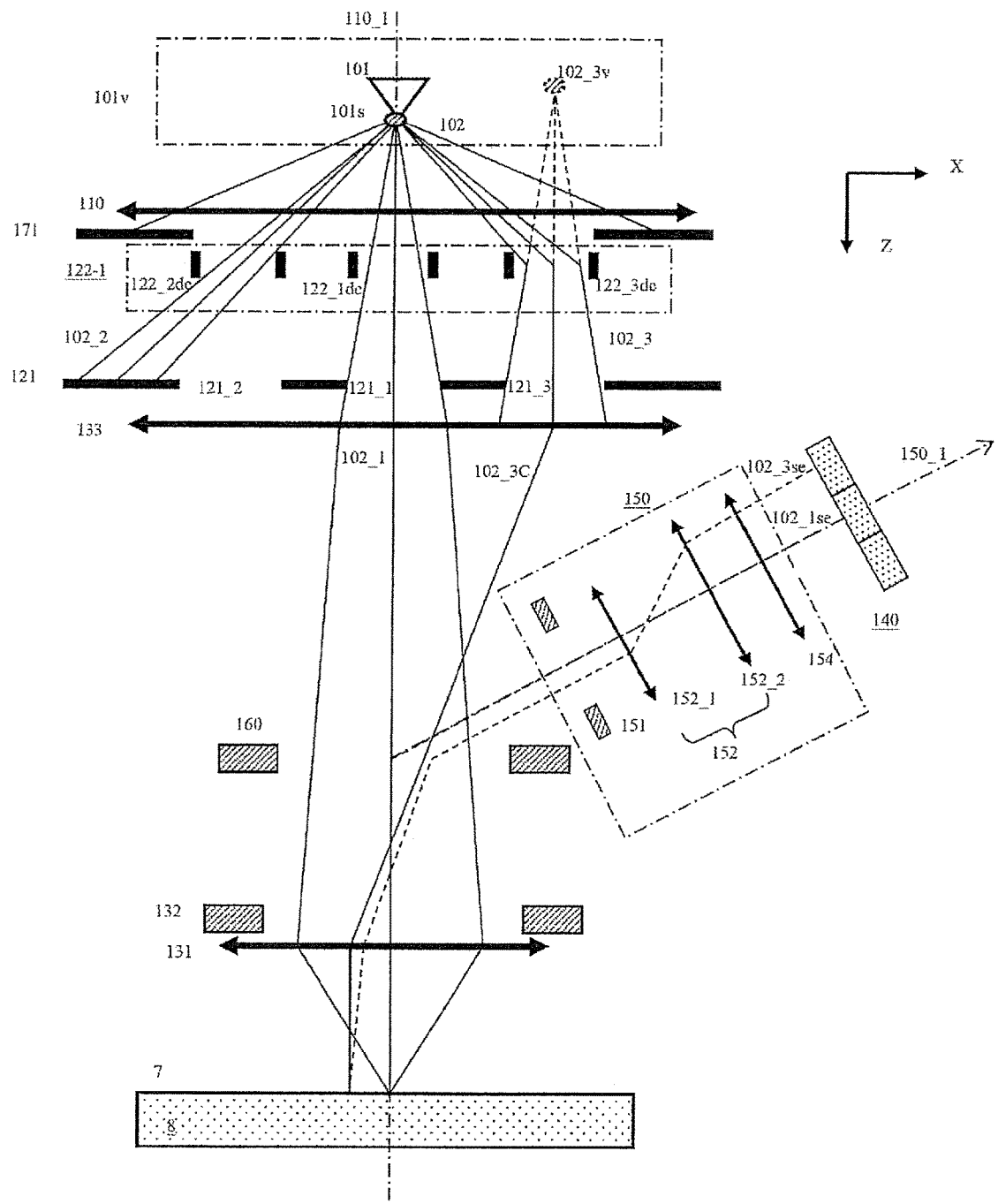
Figure 10 (Invention)

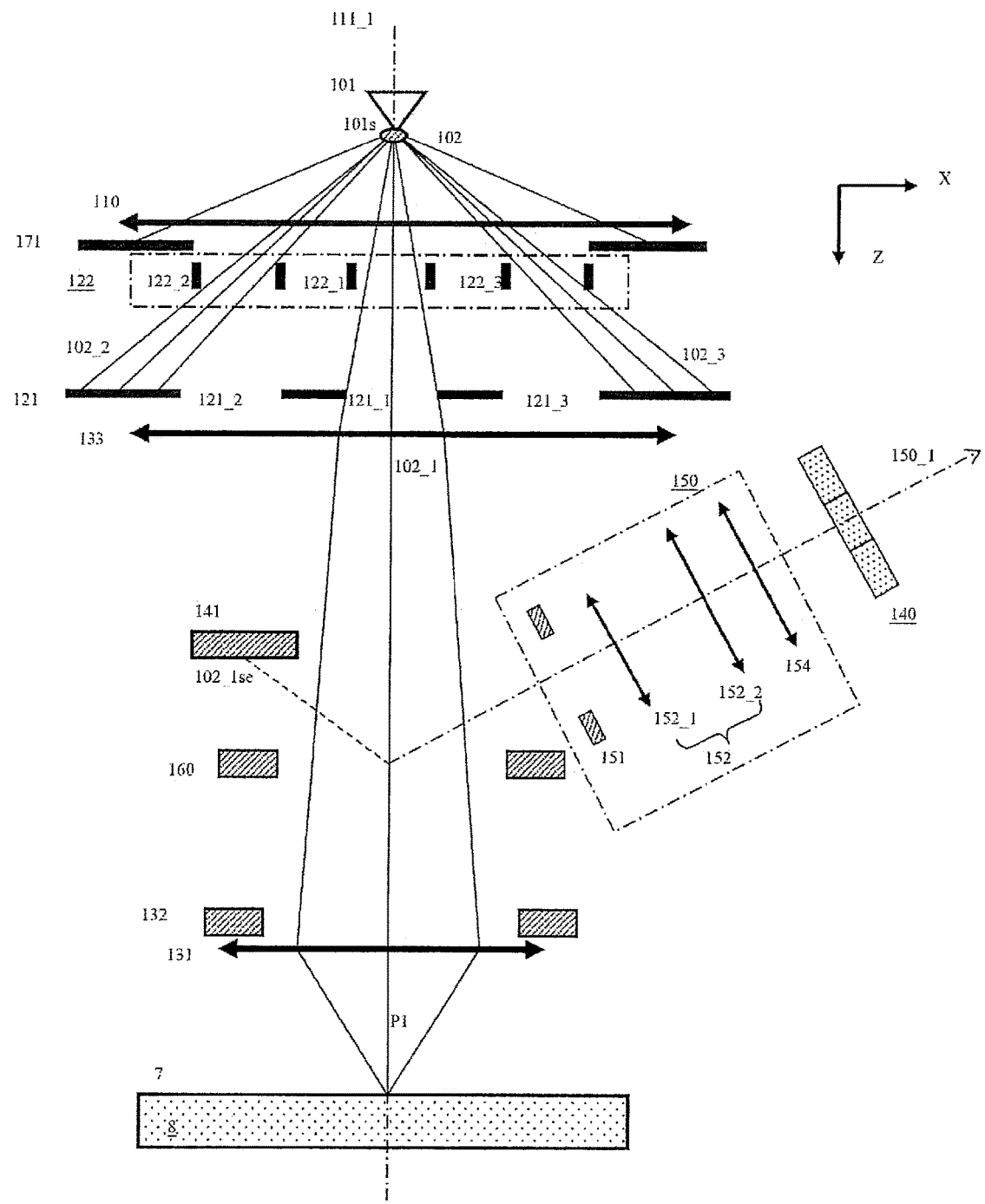
Figure 11A (Invention)

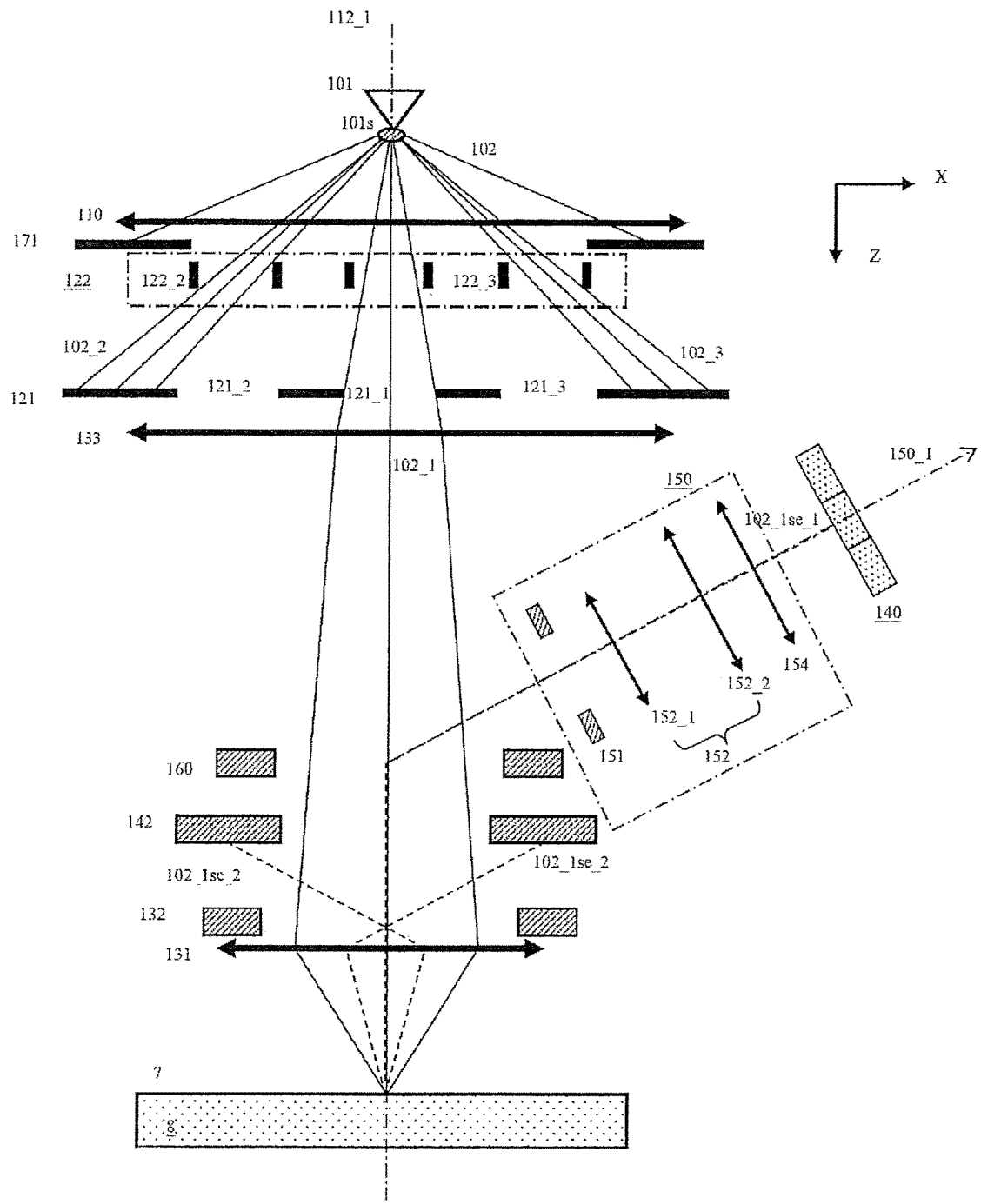
Figure 11B (Invention)

APPARATUS OF PLURAL CHARGED-PARTICLE BEAMS

CLAIM OF PRIORITY

This application is a continuation of application Ser. No. 16/398,178, filed on Apr. 29, 2019; which is a continuation of application Ser. No. 16/167,429, filed Oct. 22, 2018, now issued as U.S. Pat. No. 10,276,347; which is a divisional of application Ser. No. 15/633,639, filed Jun. 26, 2017, now issued as U.S. Pat. No. 10,109,456; which is a continuation of application Ser. No. 15/403,749, filed Jan. 11, 2017, now issued as U.S. Pat. No. 9,691,586; which is a divisional of application Ser. No. 15/065,342, filed Mar. 9, 2016, now issued as U.S. Pat. No. 9,691,588; which claims the benefit of priority of U.S. provisional application No. 62/130,819 entitled to Ren et al. filed Mar. 10, 2015, and entitled "Apparatus of Plural Charged-Particle Beams", The disclosures of the above-referenced applications are incorporated herein by reference in their entireties.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect and/or review defects on wafers/masks with high resolution and high throughput in semiconductor manufacturing industry.

2. Description of the Prior Art

For manufacturing semiconductor IC chips, pattern defects and/or uninvited particles (residuals) inevitably appear on surfaces of wafers/masks during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although the higher and higher beam currents can be used to increase the throughputs, the superior spatial resolutions will be fundamentally deteriorated by Coulomb Effect.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. For the sample surface, the plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies ≤50 eV) and back-scattered electrons (energies close to landing energies of the electrons). The secondary electrons from the plurality of small scanned regions can be respectively and simultaneously collected by a plurality of electron detectors. Consequently, the image of the large observed area including all of the small scanned regions can be obtained much faster than scanning the large observed area with a single beam.

The plurality of electron beams can be either from a plurality of electron sources respectively, or from a single electron source. For the former, the plurality of electron beams is usually focused onto and scans the plurality of small scanned regions by a plurality of columns respectively, and the secondary electrons from each scanned region are detected by one electron detector inside the corresponding column. The apparatus therefore is generally called as a multi-column apparatus. The plural columns can be either independent or share a multi-axis magnetic or electromagnetic-compound objective lens (such as U.S. Pat. No. 8,294,095). On the sample surface, the beam interval between two adjacent beams is usually as large as 30~50 mm.

For the latter, a source-conversion unit is used to virtually change the single electron source into a plurality of sub-sources. The source-conversion unit comprises one beamlet-forming means and one image-forming means. The beamlet-forming means basically comprises a plurality of beam-limit openings, which divides the primary electron beam generated by the single electron source into a plurality of sub-beams or beamlets respectively. The image-forming means basically comprises a plurality of electron optics elements, which either focuses or deflects the plurality of beamlets to form a plurality of parallel images of the electron source respectively. Each of the plurality of parallel image can be taken as one sub-source which emits one corresponding beamlet. The beamlet intervals, i.e. the beam-limit opening intervals are at micro meter level so as to make more beamlets available, and hence the source-conversion unit can be made by semiconductor manufacturing process or MEMS (Micro Electro Mechanical Systems) process. Naturally, one primary projection imaging system and one deflection scanning unit within one single column are used to project the plurality of parallel images onto and scan the plurality of small scanned regions respectively, and the plurality of secondary electron beams therefrom is respectively detected by a plurality of detection elements of one electron detection device inside the single column. The plurality of detection elements can be a plurality of electron detectors placed side by side or a plurality of pixels of one electron detector. The apparatus therefore is generally called as a multi-beam apparatus.

In the source-conversion unit 20-1 in FIG. 1A, the image-forming means 22-1 is composed of a plurality of lenses (22_1L~22_3L). The substantially parallel primary electron beam 2 from one single electron source is divided into the plurality of beamlets (2_1~2_3) by the plurality of beam-limit openings (21_1~21_3) of the beamlet-forming means 21, and the plurality of lenses respectively focuses the plurality of beamlets to form the plurality of parallel images (2_1r~2_3r) of the single electron source. The plural parallel images are typically real images, but can be virtual images in specific conditions if each of the plurality of lenses is an aperture lens. U.S. Pat. Nos. 7,244,949 and 7,880,143 respectively propose an multi-beam apparatus with one image-forming means of this type. In the source-conversion unit 20-2 in FIG. 1B, the image-forming means 22-2 is composed of a plurality of deflectors (22_2D and 22_3D). The divergent primary electron beam 2 from one single electron source is divided into the plurality of beamlets (2_2 and 2_3) by the plurality of beam-limit openings (21_2 and 21_3) of the beamlet-forming means 21, and the plurality of deflectors respectively deflects the plurality of beamlets to form a plurality of parallel virtual images (2_2v and 2_3v) of the single electron source.

The concept of using a deflector to form a virtual image of an electron source was used in the famous two-slit electron interference experiments as early as in 1950s, wherein an electron biprism is employed to forms two virtual images as shown in FIG. 2 (FIG. 1 of the paper "The Merli-Missiroli-Pozzi Two-Slit Electron-Interference Experiment" published in Physics in Perspective, 14 (2012) 178-195 by Rodolfo Rosa). The electron biprism basically comprises two parallel plates at ground potential and a very thin wire F therebetween. When a potential not equal to ground potential is applied to the wire F, the electron biprism becomes two deflectors with deflection directions opposite to each other. The primary electron beam from the electron source S passes the two deflectors and becomes two deflected beamlets which form the virtual images S1 and S2 of the electron source S. If the potential is positive, the two beamlets overlap with each other and the interference fringes appear in the overlapping area.

Since then, the foregoing concept has been employed in a multi-beam apparatus in many ways. JP-A-10-339711 and U.S. Pat. No. 8,378,299 directly use one conventional electron biprism to form two probe spots on the sample surface. U.S. Pat. No. 6,943,349 uses one annular deflector (its FIG. 5) or one corresponding deflector array (its FIG. 12) to form more than two probe spots on the sample surface and therefore can provide a higher throughput. The annular deflector includes an inner annular electrode and an outer annular electrode. If the potentials of the two annular electrodes are not equal to each other, one electric field in the local radial direction will appear within the annular gap therebetween, and consequently the annular deflector can deflect more than two beamlets together in different directions. Furthermore, the deflection function of the annular deflector can be performed by one corresponding deflector array which has a plurality of multi-pale type deflectors arranged along the annular gap.

In the conventional source-conversion unit 20-2 in FIG. 1B, due to the divergence of the primary electron beam 2, the plurality of beamlets passes through the plurality of beam-limit openings with different angles of incidence and therefore suffers strong and different electron scatterings. The scattering electrons in each beamlet will enlarge the probe spot and/or become a background noise and therefore deteriorate the image resolution of the corresponding scanned region.

In U.S. Pat. No. 6,943,349, the current of the plurality of beamlets can only be changed by varying either the emission of the single electron source or the sizes of the beam-limit openings. The single electron source takes a long time to become stable when the emission thereof is varied. The beamlet-forming means needs to have more than one group of openings and the sizes of the openings of one group are different from the other groups. It is very time-consuming to change the group in use. In addition, the secondary electron beams can only be focused onto the multiple detection elements of the in-lens detector in some specific operation conditions of the objective lens. Therefore the available applications are limit.

Accordingly, it is necessary to provide a multi-beam apparatus which can simultaneously obtain images of a plurality of small scanned regions within a large observed area on the sample surface with high image resolution and high throughput. Especially, a multi-beam apparatus which can inspect and/or review defects on wafers/masks with high resolution and high throughput is needed to match the roadmap of the semiconductor manufacturing industry.

SUMMARY OF THE INVENTION

The object of this invention is to provide a new multi-beam apparatus which can provide both high resolution and high throughput for observing a sample and especially functioning as a yield management tool to inspect and/or review defects on wafers/masks in semiconductor' manufacturing industry. The multi-beam apparatus employs a new source-conversion unit to form a plurality of parallel virtual images of a single electron source at first and limit the currents of the corresponding plurality of beamlets secondly, a condenser lens to adjust the currents of the plurality of beamlets, a primary projection imaging system to project the plurality of parallel virtual images to form a plurality of probe spots on a being-observed surface of the sample, a beam separator to deflect a plurality of secondary electron beams therefrom away from paths of the plurality of beamlets, and a secondary projection imaging system to focus the plurality of secondary electron beams to be detected respectively by a plurality of detection elements of an electron detection device.

Accordingly, the invention therefore provides a source-conversion unit, which comprises an image-forming means which comprises an upper layer with a plurality of upper 4-pole structures and a lower layer with a plurality of lower 4-pole structures, and a beamlet-limit means which is below the image-forming means and comprises a plurality of beam-limit openings. Each upper 4-pole structure is above and aligned with one corresponding lower 4-pole structure, and both have about 45° difference in azimuth and form a pair of 4-pole structures. Therefore the plurality of upper 4-pole structures and the plurality of lower 4-pole structures form a plurality of pairs of 4-pole structures. The plurality of beam-limit openings is aligned with the plurality of pairs of 4-pole structures respectively. One pair of 4-pole structure functions as a micro-deflect to deflect one beamlet of an electron beam generated by the electron source to form a virtual image thereof, a micro-lens to focus one beamlet to a desired degree, and/or a micro-stigmator to add a desired amount of astigmatism aberration to one beamlet.

The present invention also provides a multi-beam apparatus for observing a surface of a sample, which comprises an electron source, a condenser lens below the electron source, a source-conversion unit below the condenser lens, a primary projection imaging system below the source-conversion unit and comprising an objective lens, a deflection scanning unit inside the primary projection imaging system, a sample stage below the primary projection imaging system, a beam separator above the objective lens, a secondary projection imaging system above the beam separator, and an electron detection device with a plurality of detection elements. The source-conversion unit comprises an image-forming means with a plurality of micro-deflectors and a beamlet-limit means with a plurality of beam-limit openings, in which the image-forming means is above the beamlet-limit means. The electron source, the condenser lens, the source-conversion unit, the primary projection imaging system, the deflection scanning unit and the beam separator are aligned with a primary optical axis of that apparatus. The sample stage sustains the sample so that the surface faces to the objective lens. The secondary projection imaging system and the electron detection device are aligned with a secondary optical axis of the apparatus, and the secondary optical axis is not parallel to the primary optical axis. The electron source generates a primary electron beam along the primary optical axis, and the plurality of micro-deflectors deflects the primary electron beam to form a plurality of parallel virtual images of the electron source. Therefore a virtual multi-source array is converted from the electron source, and a plurality of beamlets which includes the virtual multi-source array passes through the plurality of beam-limit openings respectively. A current of each beamlet is therefore limited by one corresponding beam-limit opening, and currents of the plurality of beamlets can be varied by adjusting the condenser lens. The primary projection imaging system images the virtual multi-source array onto the surface and a plurality of probe spots is therefore formed thereon. The deflection scanning unit deflects the plurality of beamlets to scan the plurality of probe spots respectively over a plurality of scanned regions within an observed area on the surface. A plurality of secondary electron beams is generated by the plurality of probe spots respectively from the plurality of scanned regions and in passing focused by the objective lens. The beam separator then deflects the plurality of secondary electron beams to the secondary projection imaging system, and the secondary projection imaging system focuses and keeps the plurality of secondary electron beams to be detected by the plurality of detection elements respectively. Each detection element therefore provides an image signal of one corresponding scanned region.

The multi-beam apparatus may further comprise a main aperture plate below the electron source, which has a main opening aligned with the primary optical axis and functions as a beam-limit aperture for the primary electron beam. The primary projection imaging system may further comprise a transfer lens above the objective lens, which focuses the plurality of beamlets to land on the surface perpendicularly. Each of the plurality of micro-deflectors has a 4-pole structure which can generate a deflection field in any radial direction. The multi-beam apparatus may further comprise a single-beam electron detector above the beam separator, which can be used in a single-beam mode. The multi-beam apparatus may further comprise an in-lens electron detector with a beamlet-passing hole aligned with the primary optical axis, which is below the beam separator and can be used in the single-beam mode.

The present invention also provides a multi-beam apparatus for observing a surface of a sample, which comprises an electron source, a condenser lens below the electron source, a source-conversion unit below the condenser lens, a primary projection imaging system below the source-conversion unit and comprising an objective lens, a deflection scanning unit inside the primary projection imaging system, a sample stage below the primary projection imaging system, a beam separator above the objective lens, a secondary projection imaging system above the beam separator, and an electron detection device with a plurality of detection elements. The source-conversion unit comprises an image-forming means with a plurality of micro-deflector-and-compensator elements and a beamlet-limit means with a plurality of beam-limit openings, and each micro-deflector-and-compensator element comprises one micro-deflector and one micro-compensator which have one micro-lens and one micro-stigmator. The image-forming means is above the beamlet-limit means. The electron source, the condenser lens, the source-conversion unit, the primary projection imaging system, the deflection scanning unit and the beam separator are aligned with a primary optical axis of the apparatus. The sample stage sustains the sample so that the surface faces to the objective lens. The secondary projection imaging system and the electron detection device are aligned with a secondary optical axis of the apparatus, and the secondary optical axis is not parallel to the primary optical axis. The electron source generates a primary electron beam along the primary optical axis, and the plurality of micro-deflectors deflects the primary electron beam to form a plurality of parallel virtual images of the electron source. Therefore a virtual multi-source array is converted from the electron source. A plurality of beamlets which includes the virtual multi-source array passes through the plurality of beam-limit openings respectively, and a current of each beamlet is therefore limited by one corresponding beam-limit opening. Currents of the plurality of beamlets can be varied by adjusting the condenser lens. The primary projection imaging system images the virtual multi-source array onto the surface and a plurality of probe spots is therefore formed thereon. The one micro-lens and the one micro-stigmator of the one micro-compensator respectively compensates field curvature and astigmatism aberrations of one corresponding probe spot, and the deflection scanning unit deflects the plurality of beamlets to scan the plurality of probe spots respectively over a plurality of scanned regions within an observed area on the surface. A plurality of secondary electron beams is generated by the plurality of probe spots respectively from the plurality of scanned regions and in passing focused by the objective lens, and the beam separator then deflects the plurality of secondary electron beams to enter the secondary projection imaging system. The secondary projection imaging system focuses and keeps the plurality of secondary electron beams to be detected by the plurality of detection elements respectively, and each detection element therefore provides an image signal of one corresponding scanned region.

The multi-beam apparatus may further comprise a main aperture plate below the electron source, which has a main opening aligned with the primary optical axis and functions as a beam-limit aperture for the primary electron beam. Each of the plurality of micro-deflector-and-compensator element may have an 8-pole structure which functions as the one micro-deflector by generating a desired deflection field, and the one micro-compensator by generating a desired quadrupole field and a desired round-lens field. Each of the plurality of micro-deflector-and-compensator element comprises an upper 4-pole structure and a lower 4-pole structure in an upper layer and a lower layer respectively, the upper layer is above the lower layer, and the upper 4-pole structure and the lower 4-pole structure are aligned with each other and have a 45° difference in azimuth. The upper 4-pole structure and the lower 4-pole structure may function as the one micro-deflector by generating a desired deflection field and the one micro-compensator by generating a desired quadrupole field and a desired round-lens field. The primary projection imaging system may further comprise a transfer lens above the objective lens, which focuses the plurality of beamlets to land on the surface perpendicularly. The multi-beam apparatus may further comprise a single-beam electron detector above the beam separator, which can be used in a single-beam mode. The multi-beam apparatus may further comprise an in-lens electron detector with a beamlet-passing hole aligned with the primary optical axis, which is below the beam separator and can be used in the single-beam mode.

The present invention also provides a method to configure a source-conversion unit for forming a virtual multi-source array from an electron source, which comprises steps of providing an image-forming means which comprises an upper layer with a plurality of upper 4-pole structures and a lower layer with a plurality of lower 4-pole structures, and providing a beamlet-limit means which is below the image-forming means and comprises a plurality of beam-limit openings. Each upper 4-pole structure is above and aligned with one corresponding lower 4-pole structure, and both have a 45° difference in azimuth and form a pair of 4-pole structures. Therefore the plurality of upper 4-pole structures and the plurality of lower 4-pole structures form a plurality of pairs of 4-pole structures. The plurality of beam-limit openings is aligned with the plurality of pairs of 4-pole structures respectively. One pair of 4-pole structure functions as a micro-deflect to deflect one beamlet of an electron beam generated by the electron source to form a virtual image thereof, a micro-lens to focus the one beamlet to a desired degree, and/or a micro-stigmator to add a desired amount of astigmatism aberration to the one beamlet.

The source-conversion unit may comprise an upper electric-conduction plate with a plurality of upper through-holes respectively aligned with the plurality of pairs of 4-pole structures. The source-conversion unit may further comprise a lower electric-conduction plate with a plurality of lower through-holes respectively aligned with the plurality of pairs of 4-pole structures.

The present invention also provides a method for forming a virtual multi-source array from an electron source, which comprises steps of deflecting an electron beam from the electron source into a plurality of beamlets by using an upper layer with a plurality of upper 4-pole structures and a lower layer with a plurality of lower 4-pole structures, and limiting the plurality of beamlets by using a plurality of openings. Each upper 4-pole structure is above and aligned with one corresponding lower 4-pole structure, and both have a 45° difference in azimuth and form a pair of 4-pole structures.

The present invention also provides a charged-particle beam apparatus, which comprises a single charged particle source for providing a primary beam, means for converting the primary beam into a plurality of beamlets, a first projection system for forming a plurality of probe spots on a specimen from the plurality of beamlets, a deflection scanning unit for scanning the plurality of probe spots on the specimen, means for separating a plurality of signal electron beams away from the plurality of beamlets, a detection device for receiving the plurality of signal electron beams, and a second projection system for forming a plurality of signal-spots from the plurality of signal electron beams respectively on a plurality of electron detection elements of the detection device. The converting means comprising a plurality of deflectors for deflecting the plurality of beamlets and a plurality of beam-limiting openings under the plurality of deflectors. The plurality of signal electron beams is respectively generated due to the plurality of beamlets bombarding on the specimen The charged-particle beam apparatus may further comprise a condenser lens for adjusting currents of the plurality of probe spots. The converting means comprises a plurality of compensators for compensating aberrations of the plurality of probe spots respectively.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 3A is a schematic illustration of one configuration of a new multi-beam apparatus in accordance with one embodiment of the present invention.

FIGS. 3B~3D are respectively schematic illustrations of operation modes of the new multi-beam apparatus in FIG. 3A.

FIG. 4 is a schematic illustration of another configuration of the new multi-beam apparatus in accordance with another embodiment of the present invention.

FIGS. 5A~5C are respectively a schematic illustration of a configuration of an image-forming means in FIG. 3A in accordance with another embodiment of the present invention.

FIGS. 6A~6D are respectively a schematic illustration of a configuration of an image-forming means in FIG. 3A in accordance with another embodiment of the present invention.

FIG. 7 is a schematic illustration of a configuration of an advanced image-forming means in FIG. 4 in accordance with another embodiment of the present invention.

FIGS. 8A~8D are schematic illustrations of a configuration of an advanced image-forming means in FIG. 4 in accordance with another embodiment of the present invention.

FIG. 9A is a schematic illustration of another configuration of the new multi-beam apparatus in accordance with another embodiment of the present invention.

FIGS. 9B and 9C are respectively schematic illustrations of operation modes of the new multi-beam apparatus in FIG. 9A.

FIG. 10 is a schematic illustration of one operation mode of the new multi-beam apparatus in FIG. 4.

FIG. 11A is a schematic illustration of another configuration of the new multi-beam apparatus and one operation mode thereof in accordance with another embodiment of the present invention.

FIG. 11B is a schematic illustration of another configuration of the new multi-beam apparatus and one operation mode thereof in accordance with another embodiment of the present invention.

DETAILED DESCRIPTION OF EXAMPLE EMBODIMENTS

Figure 1A:
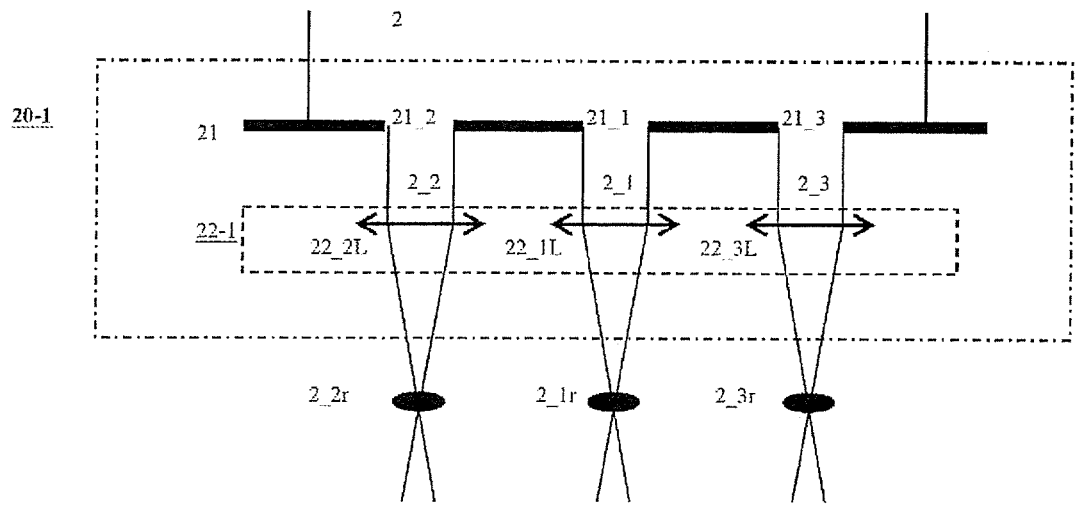
FIGS. 1A and 1B are respectively a schematic illustration of a conventional source-conversion unit.
Figure 1B:
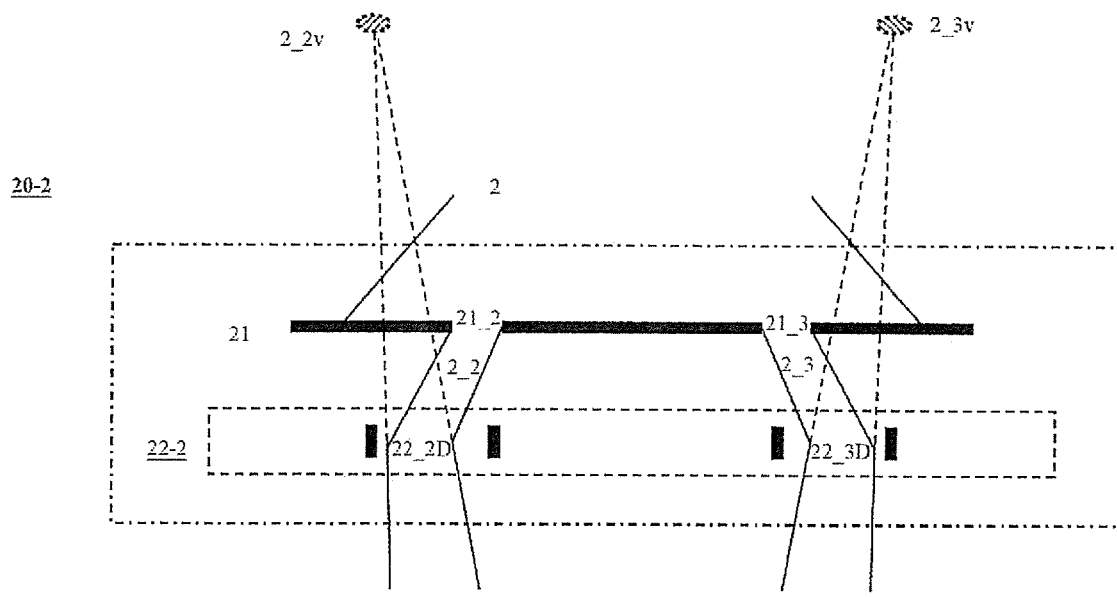
Figure 2:
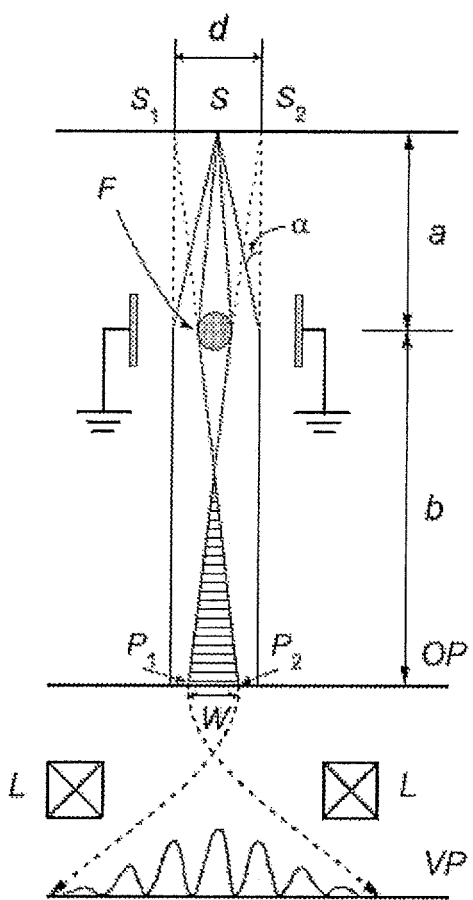
FIG. 2 is a schematic illustration of the electron interference experiment with an electron biprism.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described. For sake of clarity, only three beamlets are available in the drawings, but the number of beamlets can be anyone.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a lens (round or multi-pole), an imaging system or an apparatus", "radial" means "in a direction perpendicular to the optical axis", "on-axial" means "on or aligned with the optical axis" and "off-axis" means "not on or not aligned with the optical axis".

In this invention, "an imaging system is aligned with an optical axis" means "all the electron optics elements (such round lens and multipole lens) are aligned with the optical axis".

In this invention, X, Y and Z axe form Cartesian coordinate. The optical axis of the primary projection imaging system is on the Z-axis, and the primary electron beam travels along the Z-axis.

In this invention, "primary electrons" means "electrons emitted from an electron source and incident onto a being-observed or inspected surface of a sample, and "secondary electrons" means "electrons generated from the surface by the "primary electrons".

In this invention, "signal electrons" means "electrons generated from a being-observed or inspected surface of a sample by a primary charged particle beam".

In this invention, "single-beam mode" means only one beamlet is in use.

In this invention, all terms relate to through-holes, openings and orifices mean openings or holes penetrated through one plate.

Next, the present invention will provide some embodiments of a new multi-beam apparatus. The multi-beam apparatus employs a new source-conversion unit to form a plurality of parallel virtual images of a single electron source at first and limit the currents of a plurality of beamlets secondly, a condenser lens to adjust the currents of the plurality of beamlets, a primary projection imaging system to project the plurality of parallel virtual images to form a plurality of probe spots on a being-observed surface of the sample, a beam separator to deflect a plurality of secondary electron beams therefrom away from paths of the plurality of beamlets, and a secondary projection imaging system to focus the plurality of secondary electron beams to be detected respectively by a plurality of detection elements of an electron detection device.

The new source-conversion unit comprises an image-forming means with a plurality of micro-deflectors and a beamlet-limit means with a plurality of beam-limit openings, and the image-forming means is on the upstream of the beamlet-limit means. The primary electron beam from a single electron source is at first deflected by the plurality of micro-deflectors to form a plurality of parallel virtual images of the single electron source, and the plurality of beamlets forming the plurality of parallel virtual images will pass through the plurality of beam-limit perpendicularly or substantially perpendicularly. In this way, the plurality of beam-limit openings will not only generate fewer scattered electrons than the prior of art, but also cut off the scattered electrons generated on the upstream, and thereby eliminating the image resolution deterioration due to the electron scattering. The image-forming means can further comprise a plurality of micro-compensators to compensate off-axis aberrations (field curvature and astigmatism) of the plurality of probe spots respectively and thereby further improving the image resolution of the being-observed surface.

One embodiment 100A of the new multi-beam apparatus is shown in FIG. 3A. The single electron source 101 is on the primary optical axis 100_1. The common condenser lens 110, the main aperture plate 171, the new source-conversion unit 120, the primary projection imaging system 130, the deflection scanning unit 132 and the beam separator 160 are placed along and aligned with the primary optical axis 100_1. The secondary projection imaging system 150 and the electron detection device 140 are placed along and aligned with the secondary optical axis 150_1.

The main aperture plate 171 can be placed above the common condenser lens 9, or immediately above the new source-conversion unit 120 as shown here. The new source-conversion unit 120 comprises the micro-deflector array 122 with two micro-deflectors 122_2 and 122_3, and a beamlet-limit plate 121 with three beam-limit openings 121_1, 121_2 and 121_3, wherein the beam-limit opening 121_1 is aligned with the primary optical axis 100_1. If the beam-limit opening 121_1 is not aligned with the primary optical axis 100_1, there will be one more micro-deflector 122_1 (as shown in FIG. 5C). The primary projection imaging system 130 comprises a transfer lens 133 and an objective lens 131. The deflection scanning unit 132 comprises at least one deflector. The beam separator 160 is one Wien Filter. The secondary projection imaging system 150 comprises an anti-scanning deflector 151, a zoom lens 152 (comprising at least two lenses 152_1 and 152_2) and an anti-rotation magnetic lens 154. The electron detection device 140 comprises three detection elements 140_1, 140_2 and 140_3. Each of the foregoing lenses can be an electrostatic lens, a magnetic lens or an electromagnetic compound lens.

FIGS. 3B~3D shows three operation modes of the new multi-beam apparatus 100A. The single electron source 101 comprises a cathode, an extraction and/or an anode, wherein the primary electrons are emitted from the cathode and extracted and/or accelerated to form a primary electron beam 102 with high energy (such as 8~20 keV), a high angular intensity (such as 0.5~5 mA/sr) and a crossover (virtual or real) 101s shown by the on-axis oval mark here. Therefore it is convenient to think that the primary electron beam 102 is emitted from the crossover 101s, and the single electron source 101 is simplified to be the crossover 101s.

In FIG. 3B, the condenser lens 110 is off. The primary electron beam 102 passes through the condenser lens 110 without focusing influence and its peripheral electrons are cut off by the main opening of the main aperture plate 171. The micro-deflectors 122_2 and 122_3 respectively deflect beamlets 102_2 and 102_3 of the primary electron beam 102. The deflected beamlets 102_2 and 102_3 respectively form the off-axis virtual images 102_2v and 102_3v of the crossover 101s of the single electron source 101. The deflected beamlets 102_2 and 102_3 are parallel or substantially parallel to the primary optical axis 100_1 and therefore perpendicularly incident onto the beamlet-limit plate 121. The beam-limit openings 121_1, 121_2 and 121_3 respectively cut off the peripheral electrons of the center part 102_1 of the primary electron beam 102 and the deflected beamlets 102_2 and 102_3, and thereby limiting the currents thereof. Consequently, one virtual multi-source array 101v is formed, which comprises the crossover 101s and its two parallel off-axis virtual images 102_2v and 102_3v. One virtual image can avoid the Coulomb Effect at one real image in FIG. 1A. To further reduce Coulomb Effect, the main aperture plate 171 can be placed above the condenser lens 110 to cut off the peripheral electrons as early as possible.

Next the crossover 101s and its two parallel off-axis virtual images 102_2v and 102_3v are imaged onto the being-observed surface 7 by the transfer lens 133 and the objective lens 131, and their images form three probe spots 102_1s, 102_2s and 102_3s thereon. To make the two off-axis beamlets 102_2 and 102_3 perpendicularly landing on the being-observed surface 7, the transfer lens 133 focuses them to pass through the front focal point of the objective lens 131. If the objective lens 131 comprises one magnetic lens, the two off-axis beamlets 102_2 and 102_3 may not exactly pass through the front focal point due to the influence of magnetic rotation, and this is very helpful to reduce the Coulomb Effect at the beamlet crossover CS. The deflection scanning unit 132 deflects the three beamlets 102_1~102_3 and consequently the three probe spots 102_1s-102_3s scan three individual regions on the being-observed surface 7.

Secondary electron beams 102_1se, 102_2se and 102_3se emitted from the three scanned regions are focused by the objective lens 131 and deflected by the beam separator 160 to enter the secondary projection imaging system 150 along the secondary optical axis 150_1. The lenses 152 and 153 focus the secondary electron beams onto the three detection elements 140_1~140_3 respectively. Therefore each detection element will provide an image signal of one corresponding scanned region. If some secondary electrons of the secondary electron beam from one scanned region go to the neighboring detection elements, the image signals of neighboring detection elements will also comprise the foreign information from this scanned region, and for the neighboring detection elements the foreign information is a cross-talk from this scanned region. To avoid the cross-talks among the detection elements, the zoom lens 152 make the spot size of each secondary electron beam smaller than the corresponding detection element, and the anti-scanning deflector 151 will synchronously deflect the secondary electron beams 102_1se~102_3se to keep them within the corresponding detection elements during the deflection scanning unit 132 deflects the beamlets 102_1~102_3.

Different samples usually request different observing conditions, such as the landing energies and the currents of the beamlets. This is especially true for inspection and/or review of the defects on wafers/masks in semiconductor manufacturing industry. The focusing power of the objective lens 131 will change with the landing energies, which will influence the positions of the secondary electron beams on the electron detection device 140 and incur cross-talks. In this case, the zoom lens 152 will be adjusted to eliminate the radial displacements of the secondary electron beams. If the objective lens 131 comprises one magnetic lens, the anti-rotation magnetic lens 154 will be adjusted to eliminate the rotation of the secondary electron beams.

Each of the two off-axis probe spots 102_2s and 102_3s comprises the off-axis aberrations generated by the objective lens 131, the transfer lens 133 and the condenser lens when being turned on. The off-axis aberrations of each off-axis probe spot can be reduced by individually optimizing the trajectory of the corresponding beamlet. The static parts of the off-axis aberrations can be reduced by adjusting the deflection power of the corresponding micro-deflector. The dynamic parts of the off-axis aberrations can be reduced by optimizing the performance of the deflection scanning unit 132 which therefore may comprise more than one deflector.

Different from FIG. 3B, the condenser lens 110 is turned on in FIG. 3C, which focuses the primary electron beam 102 to form an on-axis virtual image 101sv of the crossover 101s of the single electron source 101. The micro-deflectors 122_2 and 122_3 respectively deflect beamlets 102_2 and 102_3 of the focused primary electron beam 102, and form two off-axis virtual images 102_2v and 102_3v of the crossover 101s. The deflected beamlets 102_2 and 102_3 are-parallel or substantially parallel to the primary optical axis 100_1 and therefore perpendicularly incident onto the beamlet-limit plate 121. The beam-limit openings 121_1, 121_2 and 121_3 respectively cut off the peripheral electrons of the center part 102_1 of the focused primary electron beam 102 and the deflected beamlets 102_2 and 102_3, and thereby limiting the currents thereof. The focusing function of the condenser lens 110 increase the current density of the focused primary electron beam 102, and thereby increasing the currents of the beamlets 102_1~102_3 higher than in FIG. 3B. Hence, the currents of all the beamlets can be continuously adjusted by the condenser lens 110.

Similar to a conventional SEM, the size of each probe spot is minimized by balancing the geometric and diffraction aberrations, Gaussian image size and Coulomb effect. The focusing function of the condenser lens 110 changes the imaging magnification from the crossover 101s to the being-observed surface 7, which influences the balance and therefore may increase the size of each probe spot. To avoid largely increasing the sizes of the probe spots when the currents of the beamlets are largely varied, the sizes of the beam-limit openings 121_1~121_3 can be accordingly changed. Consequently, the beamlet-limit plate 121 is preferred having multiple groups of beam-limit openings. The sizes of beam-limit openings in a group are different from those in another group. Alternately, the focusing power of the transfer lens 133 can be changed to reduce the variation of the imaging magnification. The trajectories of the off-axis beamlets 102_2 and 102_3 will be influenced by the focusing power variation of the transfer lens 133, and deflection powers of the micro-deflectors 122_2 and 122_3 can be accordingly adjusted to keep the trajectories. In this way, the beamlets 102_2 and 102_3 may be slightly not parallel to the primary optical axis 100_1, as shown in FIG. 3D.

Another embodiment 110A of the new multi-beam apparatus is shown in FIG. 4. Different from the embodiment 100A, the new source-conversion unit 120-1 comprises one micro-deflector-and-compensator array 122-1 with three micro-deflector-and-compensator elements 122_1dc, 122_2dc and 122_3dc. Each micro-deflector-and-compensator element comprises one micro-deflector and one micro-compensator having one micro-lens and one micro-stigmator. The micro-deflectors are used to form one virtual multi-source array, same as the functions of the micro-deflectors 122_2 and 122_3 shown in FIGS. 3B~3D. As well known, the condenser lens 110, the transfer lens 133 and the objective lens 131 will generate off-axis aberrations. As mentioned above, the influence of the off-axis aberrations on the sizes of the probe spots can be reduced by individually optimizing the trajectories of the beamlets. The micro-lenses and the micro-stigmators therefore will be used to compensate the left field curvature and astigmatism aberrations of the probe spots respectively. In comparison with the micro-deflector array 122 in FIG. 3A, the micro-deflector-and-compensator array 122-1 is an advanced image-forming means.

Each of the micro-deflectors 122_2 and 122_3 in FIG. 3A can simply include two parallel electrodes perpendicular to the required deflection direction of the corresponding beamlet, as shown in FIG. 5A. For example, the micro-deflector 122_2 has two parallel electrodes 122_2_e1 and 122_2_e2 perpendicular to the X-axis and thereby deflecting the beamlet 102_2 in the X-axis direction. FIG. 5B shows one embodiment of the micro-deflector array 122 to deflect eight beamlets. Due to each micro-deflector has a special orientation, it is difficult to make one micro-deflector array 122 comprising a large number of micro-deflectors. From the manufacturing point of view, all the micro-deflectors are preferred to have same configuration and same orientation in geometry. Hence a micro-deflector with a quadrupole or 4-pole configuration can meet this requirement, as shown in FIG. 5C. Four electrodes of each micro-deflector can form two deflectors which can deflect one electron beamlet in any direction. The micro-deflector 122_1 can be used if the corresponding beam-limit opening 121_1 is not correctly aligned with the primary optical axis 101.

To operate one micro-deflector, a driving-circuit needs connecting with each electrode thereof. To prevent the driving-circuits from being damaged by the primary electron beam 102, it is better placing one electric-conduction plate above the electrodes of all the micro-deflectors in FIGS. 5A~5C. Taking FIG. 5C as an example, in FIG. 6A, an upper electric-conduction plate 122-CL1 with multiple upper through-holes and an upper insulator plate 122-IL1 with multiple upper orifices are placed above the electrodes of the micro-deflectors 122_1~122_3. The electrodes of the micro-deflectors 122_1~122_3 can be attached to the upper insulator plate insulator plate 122-IL1. The upper through-holes and the upper orifices are aligned with the optical axes of the micro-deflectors respectively, such as the upper through-hole CL1_2 and the upper orifice IL1_2 are on the optical axis 122_2_1 of the micro-deflector 122_2. The radial size of each upper through-hole is equal to or smaller than the inner radial dimensions of the electrodes of the corresponding micro-deflector for protecting the driving-circuits thereof, while the radial size of each upper orifice is larger than the radial size of the corresponding upper through-hole to avoid charging-up on the inner sidewall thereof. In this way, the deflection fields of all the micro-deflectors will have short fringe ranges on the upper side, which will reduce the deflection aberrations thereof.

Based on FIG. 6A, the micro-deflector array 122 in FIG. 6B further comprises a lower electric-conduction plate 122-CL2 with multiple lower through-holes. Each lower through-hole is aligned with the optical axis of one micro-deflector, such as the lower through-hole CL2_2 is on the optical axis 122_2_1 of the micro-deflector 122_2. In this way, the deflection fields of all the micro-deflectors will have short fringe ranges on both upper and lower sides, which will reduce the deflection aberrations thereof. Different from FIG. 6B, the micro-deflector array 122 in FIG. 6C employs a lower insulator plate 122_IL2 with multiple lower orifices to support the electrodes of the micro-deflectors 122_1~122_3. Each lower orifice is aligned with the optical axis of one micro-deflector, such as the lower orifice IL2_2 is on the optical axis 122_2_1 of the micro-deflector 122_2. The radial size of each lower orifice is larger than the inner radial dimensions of the electrodes of the corresponding micro-deflector. The micro-deflector array 122 in FIG. 6D is a combination of FIG. 6B and FIG. 6C, which is more stable in configuration.

FIG. 7 shows one embodiment of the micro-deflector-and-compensator element 122_2dc of the micro-deflector-and-compensator array 122-1 in FIG. 4, which has an 8-pole configuration. The eight electrodes 122_2dc_e1~122_2dc_e8 can be driven to generate a dipole field (deflection field) in any direction with a basic amount for generating a virtual image of the electron source 1 and an additional amount for compensating distortion, a quadrupole field (astigmatism field) in any direction for compensating astigmatism and a round-lens field for compensating field curvature.

FIG. 8A shows another embodiment of the micro-deflector-and-compensator array 122-1 in FIG. 4. Each micro-deflector-and-compensator element comprises a pair of 4-pole lenses which are placed in two layers, aligned with each other and have a 45° difference in azimuth or orientation. The micro-deflector-and-compensator element 122_1dc, 122_2dc and 122_3dc are respectively composed of the pair of the upper and lower 4-pole lenses 122_1dc-1 and 122_1dc-2, the pair of the upper and lower 4-pole lenses 122_2dc-1 and 122_2dc-2, and the pair of the upper and lower 4-pole lenses 122_3dc-1 and 122_3dc-2. The upper 4-pole lenses 122_1dc-1, 122_2dc-1 and 122_3dc-1 are placed in the upper layer 122-1-1, and the lower 4-pole lenses 122_1dc-2, 122_2dc-2 and 122_3dc-2 are placed in the lower layer 122-1-2 and respectively aligned with the upper 4-pole lenses 122_1dc-1, 122_2dc-1 and 122_3dc-1. As an example, with respect to the X axis, the azimuths of the upper 4-pole lenses 122_1dc-1, 122_2dc-1 and 122_3dc-1 are 0° as shown in FIG. 8B, and the azimuths of the lower 4-pole lenses 122_1dc-2, 122_2dc-2 and 122_3dc-2 are 45° as shown in FIG. 8C. In FIG. 8D, similar to FIG. 6D, the upper and lower layers are shielded by the upper and lower electric-conduction plate 122-CL1 and 122-CL2, and supported by the upper and lower insulator plates 122-IL1 and 122-IL2 and a middle insulator plate 122-IL3 with multiple middle orifices. For each micro-deflector-and-compensator element, the deflection field in any desired direction and the round-lens field can be generated by either or both of the upper and lower 4-pole lenses, and the quadrupole field in any direction can be generated by both of the upper and lower 4-pole lenses.

Another embodiment 200A of the new multi-beam apparatus is shown in FIG. 9A. In comparison with the embodiment 110A in FIG. 4, the transfer lens 133 is removed from the primary projection imaging system. FIG. 9B shows one operation mode, wherein the off-axis beamlets 102_2 and 102_3 are respectively deflected parallel to the primary optical axis 200_1 by the micro-deflector-and-compensator elements 122_2dc and 122_3dc, and obliquely land on being-observed surface 7. This mode can be used to the observation applications which have no strict requirements on the incident situations of the beamlets or require stereo-imaging. The micro-deflector-and-compensator elements 122_2dc and 122_3dc can compensate the large off-axis aberrations of the two off-axis beamlets 102_2 and 102_3 due to passing through the objective lens 131 with large radial shifts. FIG. 9C shows another operation mode, wherein the off-axis beamlets 102_2 and 102_3 are respectively further deflected by the micro-deflector-and-compensator elements 102_2dc and 102_3dc towards the primary optical axis 200_1, and accordingly less obliquely land on the being-observed surface 7. If the micro-deflector-and-compensator elements 122_2dc and 122_3dc respectively deflect the off-axis beamlets 102_2 and 102_3 to pass through the front focal point of the objective lens 131, the off-axis beamlets 102_2 and 102_3 will be normally incident onto the being-observed surface 7. To avoid the off-axis beamlets 102_2 and 102_3 passing through the beam-limit openings with large angles of incidence, it is preferred to keep a long distance between the front focal point of the objective lens 131 and the micro-deflector-and-compensator array 122-1.

As well known, the more beamlets scan the being-observed surface 7, the more charges may be built thereon. Hence for a specific observation application, some of the beamlets may be not needed. In this case, those beamlets can be directed to be blanked by the beamlet-limit plate. FIG. 10 shows such an operation mode of the embodiment 110A in FIG. 4, wherein the micro-deflector-and-compensator 122_2dc is off and the beamlet 102_2 is cut off by the beamlet-limit plate 121. The micro-deflector-and-compensator 122_2dc may need to be turned on to direct the beamlet 102_2 cut off by the beamlet-limit plate 121, which is up to the detailed structure of the source-conversion unit 120-1.

Based on the embodiment 110A in FIG. 4, another embodiment 111A of the new multi-beam apparatus is proposed in FIG. 11A, wherein a single-beam electron detector 141 is added. When only one beamlet is needed for some reasons such as searching optimistic imaging conditions (landing energy and probe current) for an observation application, the apparatus will work on a single-beam mode. In this case, beam-separator 160 can deflect the corresponding secondary electron beam to the single-beam electron detector 141. Here the beamlet 102_1 is taken as the beamlet in use. The secondary electron beam 102_1se generated by the beamlet 102_1 is deflected to be detected by the single-beam electron detector 141. Using the single-beam electron detector 141 can avoid the procedures of adjusting the secondary projection imaging system 150 with respect to the focusing power variation of the objective lens 131. As mentioned above, the focusing power of the objective lens 131 will change when the landing energy and/or current of the beamlet in use are changed. Furthermore, FIG. 11B shows one more embodiment 112A of the new multi-beam apparatus, wherein an in-lens electron detector 142 with a beamlet-passing hole is placed below the beam separator 160. When the apparatus works in the single-beam mode, within the secondary electron beam with respect to the beamlet in use, the secondary electrons with large emission angles can be detected by the in-lens electron detector 142, and the secondary electrons with small emission angles will pass through the beamlet-passing hole and be detected by the corresponding detection element of the electron detection device 140. Here the beamlet 102_1 is taken as the beamlet in use. Within the secondary electron beam 102_1se generated by the beamlet 102_1, the secondary electrons 102_1se_2 with large emission angles hit the in-lens electron detector 142 and the secondary electrons 102_1se_1 with small emission angles are deflected to be detected by the electron detection device 140. The single-beam electron detector 141 and the in-lens electron detector 142 can be used in combination. In this case, the secondary electrons 102_1se_2 with large emission angles can be detected by the in-lens electron detector 142 and the secondary electrons 102_1se_1 with small emission angles can be deflected by the beam separator 160 to be detected by the single-beam electron detector 141. Although it is not shown here, the in-lens electron detector 142 can also be placed above the beam separator 160. In this case, the in-lens electron detector 142 can detect the outer part of the secondary electron beam 102_1se when the beam separator is off.

In summary this invention proposes a new multi-beam apparatus for observing a sample with high resolution and high throughput. The new multi-beam apparatus can function as a yield management tool to inspect and/or review defects on wafers/masks in semiconductor manufacturing industry. The multi-beam apparatus employs a new source-conversion unit to form a plurality of parallel virtual images of a single electron source, a condenser lens to adjust the currents of the plurality of beamlets, a primary projection imaging system to project the plurality of parallel virtual images to form a plurality of probe spots on a being-observed surface of the sample, a beam separator to deflect a plurality of secondary electron beams therefrom away from paths of the plurality of beamlets, and a secondary projection imaging system to focus the plurality of secondary electron beams to be detected respectively by a plurality of detection elements of an electron detection device. In the new source-conversion unit, the image-forming means is on the upstream of the beamlet-limit means, and thereby mitigating the image resolution deterioration due to the electron scattering. The image-forming means comprises a plurality of micro-deflectors for forming the plurality of parallel virtual images, or a plurality of micro-deflector-and-compensator elements for forming the plurality of parallel virtual images and compensating the off-axis aberrations of the plurality of probe spots.

Although the present invention has been explained in relation to its preferred embodiment, it is to be understood that other modifications and variation can be made without departing the spirit and scope of the invention as hereafter claimed.

What is claimed is:

1. A charged-particle beam apparatus, comprising:
    an image-forming unit configured to form a plurality of images of a charged particle source using a plurality of beamlets of a primary beam, the image-forming unit comprising a first layer of multi-pole elements and a second layer of multi-pole elements, wherein the multi-pole elements of the first layer are aligned with the multi-pole elements of the second layer in a direction parallel to a primary optical axis of the apparatus;
    a first projection system configured to form a plurality of probe spots on a sample from the plurality of beamlets of the primary beam;
    a second projection system configured to focus a plurality of secondary beams generated by the plurality of probe spots on the sample; and
    a detection device configured to receive the plurality of secondary beams.

2. The charged-particle beam apparatus of claim 1, wherein the multi-pole elements of the second layer are micro-deflectors.

3. The charged-particle beam apparatus of claim 1, wherein the multi-pole elements of the first layer are micro-deflectors.

4. The charged-particle beam apparatus of claim 1, wherein the multi-pole elements of the first and second layers are micro-deflectors.

5. The charged-particle beam apparatus of claim 1, further comprising a beam separator configured to separate the plurality of beamlets and the plurality of secondary beams.

6. The charged-particle beam apparatus of claim 1, wherein the detection device further comprises a plurality of detection elements.

7. The charged-particle beam apparatus of claim 1, wherein the second projection system includes an anti-rotation magnetic lens configured to minimize a rotation of the plurality of secondary beams directed to the detection device.

8. The charged-particle beam apparatus of claim 1, wherein the first projection system includes a transfer lens to focus the plurality of beamlets to land on the sample perpendicularly.

9. The charged-particle beam apparatus of claim 8, wherein the transfer lens is configured to focus the plurality of beamlets to pass through a front focal point of an objective lens.

10. The charged-particle beam apparatus of claim 8, wherein the transfer lens is configured to reduce variation of imaging magnification by adjusting a focusing power of the transfer lens.

11. The charged-particle beam apparatus of claim 10, wherein the transfer lens is configured to influence the trajectory of the corresponding beamlet by adjusting the focusing power.

12. The charged-particle beam apparatus of claim 1, further comprising:
a deflection scanning unit configured to scan the plurality of probe spots on the sample.

13. The charged-particle beam apparatus of claim 12, wherein the deflection scanning unit is configured to reduce off-axis aberrations of each off-axis beamlet by individually optimizing a trajectory of a corresponding beamlet.

14. The charged-particle beam apparatus of claim 13, wherein the deflection scanning unit comprises a plurality of deflectors and each deflector of the plurality of deflectors is configured to reduce off-axis aberrations of each off-axis beamlet by individually optimizing a trajectory of a corresponding beamlet.

15. The charged-particle beam apparatus of claim 1, further comprising:
a beam-limiting element having a plurality of beam-limit openings for limiting the plurality of beamlets.

16. The charged-particle beam apparatus of claim 1, further comprising:
a condenser lens configured to focus the primary beam to vary electric currents of the plurality of probe spots on the sample.

17. The charged-particle beam apparatus of claim 1, wherein the second projection system includes a zoom lens configured to minimize radial displacements of the plurality of secondary beams.

18. The charged-particle beam apparatus of claim 17, wherein the zoom lens includes a plurality of lenses.

19. The charged-particle beam apparatus of claim 17, wherein the zoom lens and an anti-rotation magnetic lens are configured to focus the plurality of secondary beams onto the detection element.

* * * * *